US011102904B2

(12) United States Patent
Noda et al.

(10) Patent No.: US 11,102,904 B2
(45) Date of Patent: Aug. 24, 2021

(54) ELECTRONIC COMPONENT ASSEMBLY, COMBINATION OF ELECTRONIC COMPONENT ASSEMBLY AND ADHEREND, AND METHOD FOR MOUNTING ELECTRONIC COMPONENT

(71) Applicant: HOSIDEN CORPORATION, Yao (JP)

(72) Inventors: Shushin Noda, Yao (JP); Daisuke Kusuda, Yao (JP); Kota Onoyama, Yao (JP); Atsuro Takeshita, Yao (JP)

(73) Assignee: Hosiden Corporation, Yao (JP)

( * ) Notice: Subject to any disclaimer, the term of this patent is extended or adjusted under 35 U.S.C. 154(b) by 3 days.

(21) Appl. No.: 16/854,226

(22) Filed: Apr. 21, 2020

(65) Prior Publication Data

US 2020/0375055 A1 Nov. 26, 2020

(30) Foreign Application Priority Data

May 20, 2019 (JP) .............................. JP2019-094462
Aug. 26, 2019 (JP) .............................. JP2019-153819

(51) Int. Cl.
*H05K 1/18* (2006.01)
*H05K 7/14* (2006.01)
(Continued)

(52) U.S. Cl.
CPC ........ *H05K 7/1427* (2013.01); *B60R 11/0247* (2013.01); *H05K 1/181* (2013.01);
(Continued)

(58) Field of Classification Search
CPC .................................................. H05K 7/1427
(Continued)

(56) References Cited

U.S. PATENT DOCUMENTS

2008/0184802 A1 8/2008 Sato
2012/0000302 A1 1/2012 Inoue et al.

FOREIGN PATENT DOCUMENTS

DE 102008008042 A1 * 2/2007
DE 102008007042 A1 8/2008
(Continued)

OTHER PUBLICATIONS

Extended European Search Report for European Application No. EP 20171416.9 published by the European Patent Office (EPO), dated Jul. 2, 2020, including corresponding Communication, 4-page EPO Form 1703, European Search Report and 1-page Annex.

*Primary Examiner* — Stanley Tso
(74) *Attorney, Agent, or Firm* — Kilyk & Bowersox, P.L.L.C.

(57) ABSTRACT

An electronic component assembly including a fixing part fixable to a first face on a first-direction side of an adherend, an electronic component, and a housing. The adherend has a housing hole opening in the first face. The housing includes a fixed portion fixed to the fixing part and a housing body to house the electronic component. The housing body includes a first portion disposed on a second-direction side relative to the fixing part. The second direction is opposite to the first direction. The first portion of the housing body has a dimension in the second direction that is equal to, or smaller than, a dimension in the second direction of the housing hole of the adherend. The first portion of the housing body is configured to be housed in the housing hole of the adherend.

18 Claims, 14 Drawing Sheets

(51) Int. Cl.
 *B60R 11/02* (2006.01)
 *H05K 13/00* (2006.01)
(52) U.S. Cl.
 CPC .................... *H05K 13/0015* (2013.01); *H05K 2201/10189* (2013.01)
(58) Field of Classification Search
 USPC ......................................................... 361/752
 See application file for complete search history.

(56) References Cited

FOREIGN PATENT DOCUMENTS

| | | |
|---|---|---|
| DE | 102010044996 A1 | 3/2012 |
| DE | 102010049818 A1 | 5/2012 |
| DE | 102015212599 B3 | 6/2016 |
| DE | 102015016206 A1 | 6/2017 |
| JP | 2009-264564 A | 11/2009 |

* cited by examiner

ELECTRONIC COMPONENT ASSEMBLY, COMBINATION OF ELECTRONIC COMPONENT ASSEMBLY AND ADHEREND, AND METHOD FOR MOUNTING ELECTRONIC COMPONENT

CROSS-REFERENCE TO RELATED APPLICATIONS

The present application claims priority under 35 U.S.C. § 119 of Japanese Patent Application Nos. 2019-094462 and 2019-153819 filed on May 20, 2019, and Aug. 26, 2019, respectively, the disclosures of which are expressly incorporated by reference herein in their entireties.

BACKGROUND OF THE INVENTION

Technical Field

The invention relates to electronic component assemblies, combinations of electronic component assemblies and adherends, and methods for mounting electronic components.

Background Art

Japanese Unexamined Patent Publication No. 2009-264564 describes a conventional combination of an electronic component assembly and an adherend. This combination includes a lining (headliner) of a ceiling part of an automobile, an electronic component serving as a microphone, an exterior case, and a mounting part. The headliner includes the adherend. The adherend has an upper face on one side in its thickness direction, a lower face opposite to the upper face, and a through-hole extending from the upper face to the lower face. The microphone is covered with the exterior case of metal. The exterior case includes a first side face with two first engaging holes, and an opposite, or second, side face with two second engaging holes. The microphone with the exterior case is disposed above the through-holes of the adherend. The mounting part includes a base, two first legs, and two second legs. The base of the mounting part abuts the lower face of the adherend so as to close the through-hole of the adherend. The first and second legs of the mounting part are inserted through the through-hole of the adherend from the lower face side of the adherend. The first and second legs have respective claws disposed above the upper face of the adherend. The claws of the first legs are hooked on the corresponding first engaging holes of the exterior case of the microphone, and the claws of the second legs are hooked on the corresponding second engaging holes of the exterior case of the microphone. Accordingly, the microphone with the exterior case is fixed on the upper face side of the adherend.

SUMMARY OF INVENTION

The lower face of the adherend of the lining of the ceiling part of the car is covered with a cushioning material, and the cushioning material is covered with a cloth. The base of the mounting part is disposed on the lower face of the adherend, so that the cushioning material and the cloth deform conforming to the base. As a result, the shape of the base appears on the cushioning material and the cloth.

Thus, the invention provides an electronic component assembly, a combination of the electronic component assembly and an apprehend, and a method for mounting an electronic component, in which an electronic component is assembled to an adherend with no part of the electronic component assembly disposed on the side of a particular face of an adherend.

An electronic component assembly according to an aspect of the invention includes a fixing part fixable to a first face on a first-direction side of an adherend, an electronic component, and a housing. The adherend has a housing hole opening in the first face. The housing includes a fixed portion fixed to the fixing part and a housing body to house the electronic component. The housing body includes a first portion disposed on a second-direction side relative to the fixing part. The second direction is opposite to the first direction. The first portion of the housing body has a dimension in the second direction that is equal to, or smaller than, a dimension in the second direction of the housing hole of the adherend. The first portion of the housing body is configured to be housed in the housing hole of the adherend.

The electronic component assembly of this aspect is configured such that when the electronic component assembly is fixed to the first face of the adherend, no part of the electronic component assembly is disposed on the side of the second face, i.e. on the second-direction side, of the adherend for the following reasons. First, the fixing part is fixed to the first face of the adherend. Second, the first portion of the housing body of the housing has a dimension in the second direction that is equal to, or smaller than, that of the housing hole opening in the first face of the adherend. As such, when housed in the housing hole of the adherend, the first portion of the housing body of the housing does not protrude in the second direction relative to the second face of the adherend.

The housing body may be of a generally tubular shape opening in the first direction and include a bottom on the second-direction side. The fixed portion may extend from the housing body and be located on the first-direction side relative to the first portion of the housing body.

The bottom of the housing body may be provided with at least one through-hole extending through the bottom in the second direction.

The housing may be formed of a thin metal plate. In the electronic component assembly of this aspect, the housing, formed of a thin metal plate, has a reduced thickness. Accordingly, the first portion of the housing body of the housing has a reduced dimension in the second direction. This configuration makes it easy to house the first portion of the housing body of the housing in the housing hole of the adherend without protruding the first portion in the second-direction side relative to the second face of the adherend.

The bottom of the housing body of the housing may be in direct or indirect abutment with the electronic component.

The electronic component assembly of any of the above aspects may further include a support. The support may include a support body fixed to the fixing part and a leg extending from the support body in the second direction. The leg may be received in the housing body of the housing and be in direct or indirect abutment with the electronic component. In the electronic component assembly of this aspect, as the electronic component is held between the bottom of the housing and the leg, it is easy to fix the electronic component in position inside the housing.

The electronic component assembly of any of the above aspects may further include a circuit board fixed to the support body and at least one of a connector or a circuit part mounted on the circuit board and electrically connected to the electronic component.

The fixing part may include a first fixing part and a second fixing part. The first fixing part may be attached the second fixing part. The second fixing part may be fixable to the first face of the adherend. The fixed portion of the housing may be fixed to the first fixing part.

The electronic component assembly of any of the above aspects may further include a holder constituted by an elastic body. The holder may hold the electronic component and be housed in the housing together with the electronic component. The holder may abut the bottom of the housing body and also abut the leg of the support.

The electronic component assembly of any of the above aspects may further include a seal member. The seal member may be fixed to a face on the second-direction side of the fixing part and configured to contact the first face of the adherend. The seal member may include a through-hole extending in the second direction through the seal member. The first portion of the housing body of the housing may be inserted through the insertion hole.

The fixing part may include a first protrusion. The first protrusion may protrude in the second direction and being configured to fit in a positioning hole in the first face of the adherend.

A combination of an electronic component assembly and an adherend according to an aspect of the invention includes an adherend and the electronic component assembly of any of the above aspects. The adherend includes a first face on a first-direction side, a second face on a second-direction side, and a housing hole opening in the first face. The second direction is opposite to the first direction. The fixing part of the electronic component assembly is fixed to the first face of the adherend. The first portion of the housing of the electronic component assembly is housed in the housing hole of the adherend without protruding in the second direction relative to the second face of the adherend.

The combination of this aspect is configured such that the fixing part is only fixed to the first face of the adherend, and the housing is housed in the housing hole of the adherend without protruding in the second direction relative to the second face of the adherend. Accordingly, no part of the electronic component assembly protrudes on the side of the second face of the adherend.

The combination may further include a seal member compressed between the first face of the adherend and the fixing part. The seal member may have a through-hole extending in the second direction through the seal member. The first portion of the housing body of the housing of the electronic component assembly may be inserted through the through-hole.

One of the fixing part and the first face of the adherend may be provided with a first protrusion, and the other may be provided with a positioning hole. The first protrusion may be fitted in the positioning hole. The first protrusion comprises at least one first protrusion and may comprise a plurality of first protrusions. Likewise, the positioning hole comprises at least one positioning hole and may comprise a plurality of positioning holes as many as the first protrusions.

A method for mounting an electronic component according to an aspect of the invention includes: preparing an adherend including a first face on a first-direction side, a second face on a second-direction side, and a housing hole opening in the first face, the second direction being opposite to the first direction; preparing a fixing part and a housing, the housing including a housing body and a fixed portion, the housing body opening in the first direction and including a first portion, the first portion being disposed on a second-direction side relative to the fixing part, the fixed portion being fixed to the fixing part; arranging the first portion of the housing body of the housing to be housed in the housing hole of the adherend, without protruding the first portion of the housing body to the second-direction side relative to the second face of the adherend, and placing the fixing part on the first face of the adherend; fixing the fixing part to the first face of the adherend; preparing an electronic component before or after placing the fixing part; and arranging the prepared electronic component to be housed inside the housing body.

In the method of this aspect, the fixing part is only fixed to the first face of the adherend, and the housing is housed in the housing hole of the adherend without protruding in the second direction relative to the second face of the adherend. Accordingly, no part of the electronic component assembly protrudes on the side of the second face of the adherend.

The arranging of the electronic component to be housed inside the housing body may include bringing the electronic component into abutment with a bottom of the housing body. The method may further include preparing a support, the support including a support body and a leg extending in the second direction from the support body; after the electronic component is housed in the housing body, inserting the leg of the support into the housing body of the housing to bring the leg into abutment with the electronic component; and fixing the support body to the fixing part. The method of this aspect allows the electronic component to be brought into abutment with, and thereby held between, the bottom of the housing body and the leg.

Where the electronic component is held in the holder described above, the arranging of the electronic component to be housed inside the housing body may include arranging the electronic component and the holder to be housed inside the housing body with the holder in abutment with a bottom of the housing body. Also, the method may further comprise preparing a support, the support including a support body and a leg extending in the second direction from the support body; after the electronic component and the holder are housed in the housing body, inserting the leg of the support into the housing body of the housing to bring the leg into abutment with the holder; and fixing the support body to the fixing part. The method of this aspect allows the holder and the electronic component to be brought into abutment with, and thereby held between, the bottom of the housing body and the leg.

Where the fixing part includes a first fixing part and a second fixing part, the first fixing part may be attached the second fixing part, the fixed portion of the housing may be fixed to the first fixing part, and the fixing of the fixing part to the first face of the adherend may include fixing the second fixing part to the first face of the adherend.

The method for mounting an electronic component may further include preparing a seal member surrounding the first portion of the housing body of the housing. The placing of the fixing part on the first face of the adherend may include arranging the seal member to be held between the first face of the adherend and the fixing part. The fixing of the fixing part to the first face of the adherend may include compressing the seal member between the first face of the adherend and the fixing part.

The placing of the fixing part on the first face of the adherend may include fitting one or a plurality of first protrusions into a positioning hole or respective positioning holes.

BRIEF DESCRIPTION OF DRAWINGS

The present invention can be even more fully understood with the reference to the accompanying drawings which are intended to illustrate, not limit, the present invention.

Figure 1A:
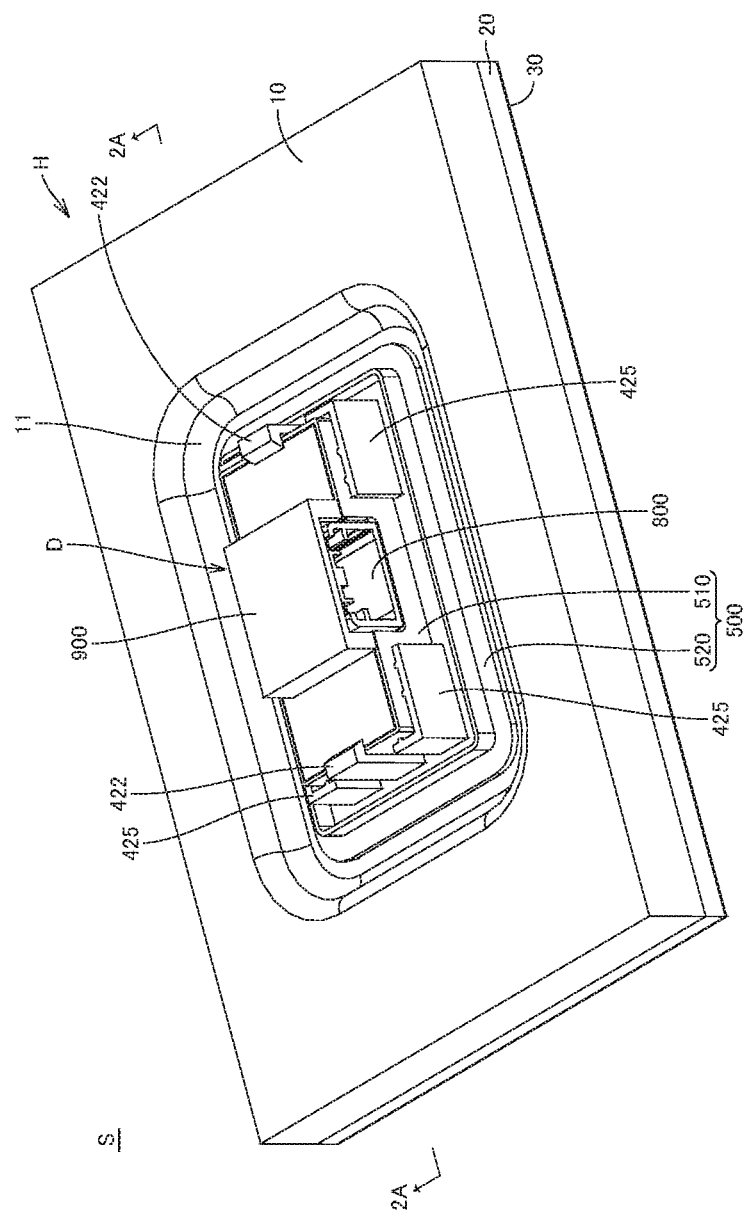
FIG. 1A is a front, top, right side perspective view of a combination of an electronic component assembly and an adherend according to a first embodiment of the invention.
Figure 1B:
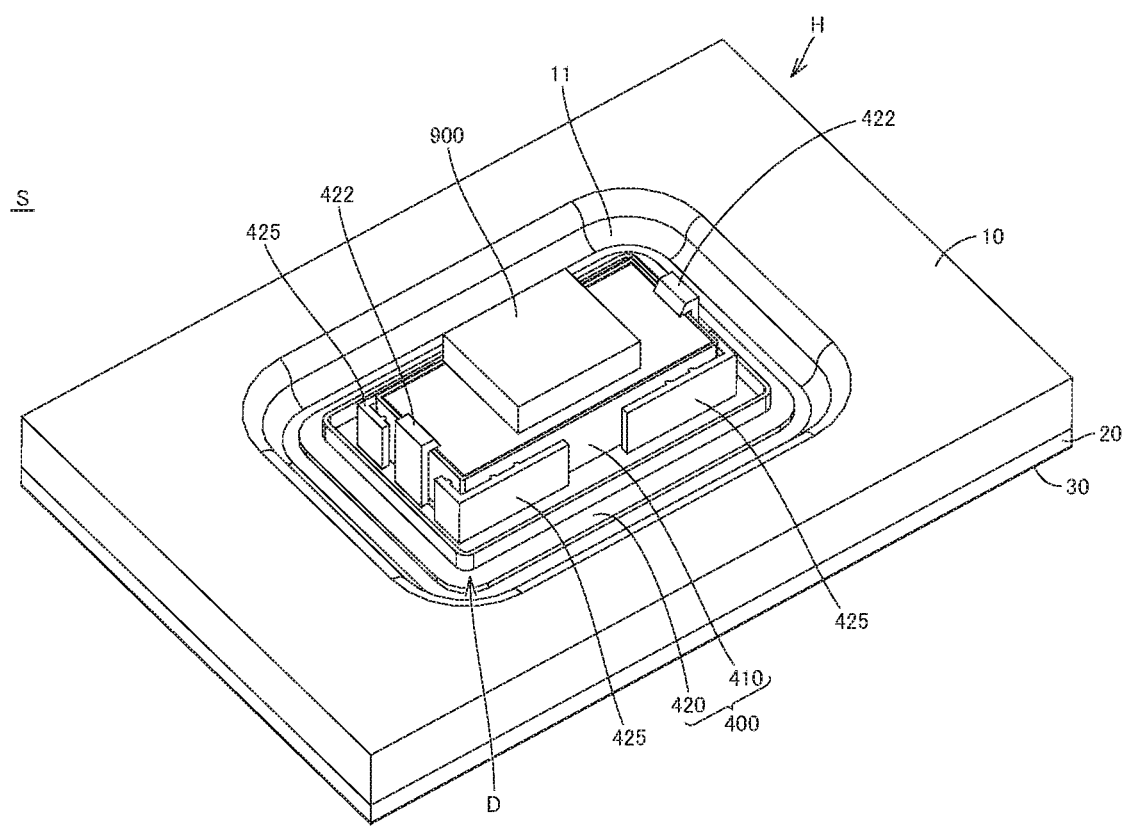
FIG. 1B is a rear, top, left side perspective view of the combination.

In the brief description of the drawings above and the description of embodiments which follows, relative spatial terms such as "upper", "lower", "top", "bottom", "left", "right", "front", "rear", etc., are used for the convenience of the skilled reader and refer to the orientation of the electronic component assemblies, combinations of electronic component assemblies and adherends, and their constituent parts as depicted in the drawings. No limitation is intended by use of these terms, either in use of the invention, during its manufacture, shipment, custody, or sale, or during assembly of its constituent parts or when incorporated into or combined with other apparatus.

DESCRIPTION OF EMBODIMENTS

Various embodiments of the invention will now be described. Elements of the embodiments and the design variations to be described can be combined with in any possible manner. Materials, shapes, dimensions, numbers, arrangements, etc. of the constituents of the combination of an electronic component assembly and an adherend, and those of the electronic component assembly, in the embodiments and the design variations will be discussed below as examples and can be modified as long as they achieve similar functions.

First Embodiment

Hereinafter described is a combination S of an electronic component assembly D and an adherend 10 (this combination may be referred to simply as a combination S) according to various embodiments the invention, including a first embodiment, with reference to FIGS. 1A to 5B. FIGS. 1A to 5B. These figures illustrate the combination S of the first embodiment.

Figure 2A:
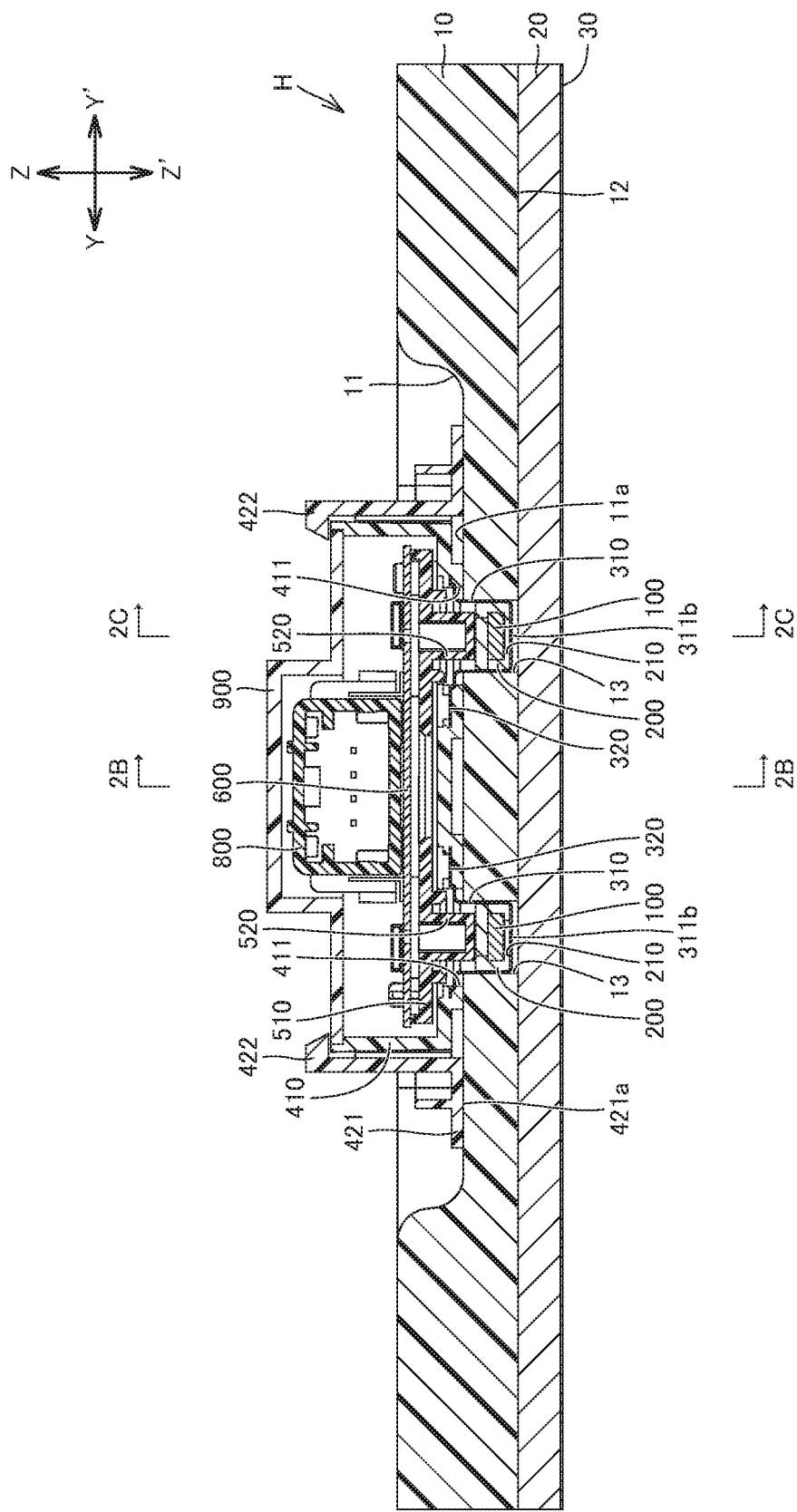
FIG. 2A is a sectional view of the combination, taken along line 2A-2A in FIG. 1A.
Figure 2B:
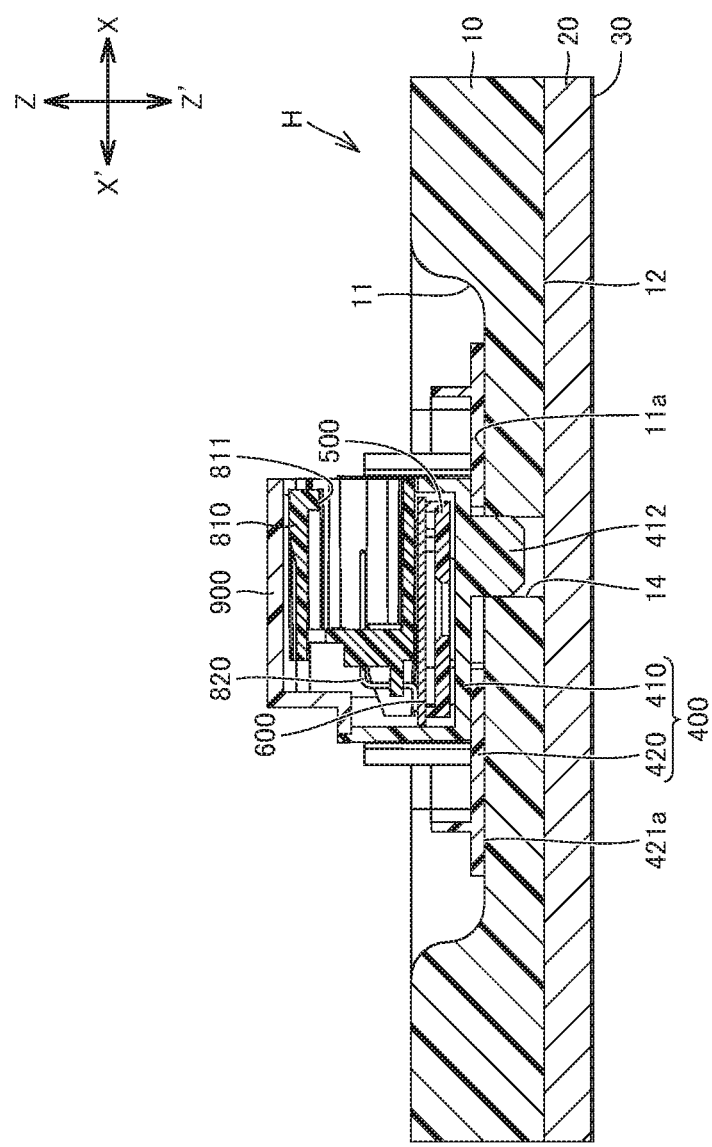
FIG. 2B is a sectional view of the combination, taken along line 2B-2B in FIG. 2A.
Figure 2C:
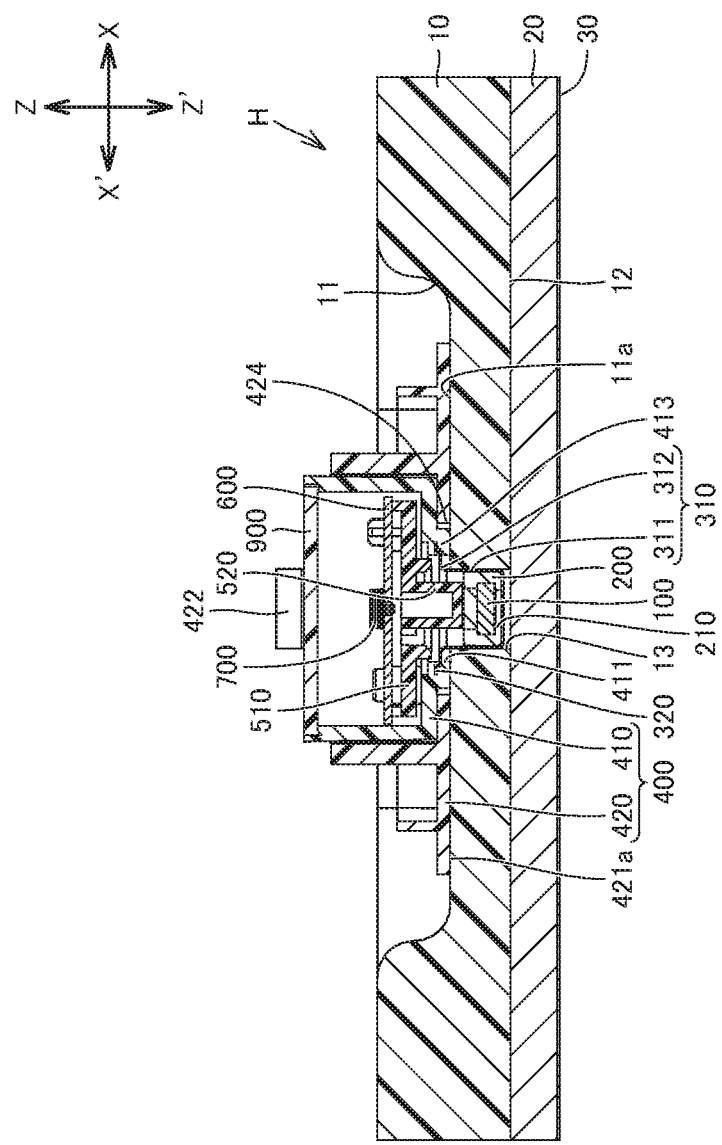
FIG. 2C is a sectional view of the combination, taken along line 2C-2C in FIG. 2A.
Figure 3:
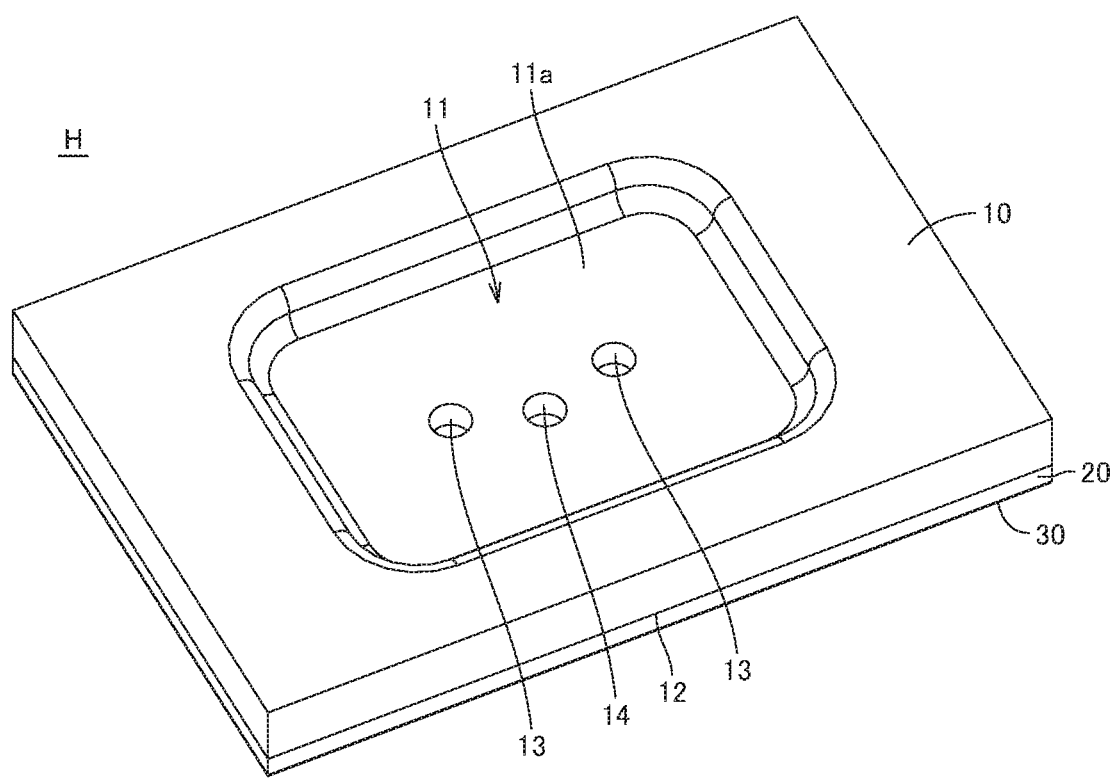
FIG. 3 is a front, top, right side perspective view of an adherend, a cushioning material, and a cloth of the combination.
Figure 4A:
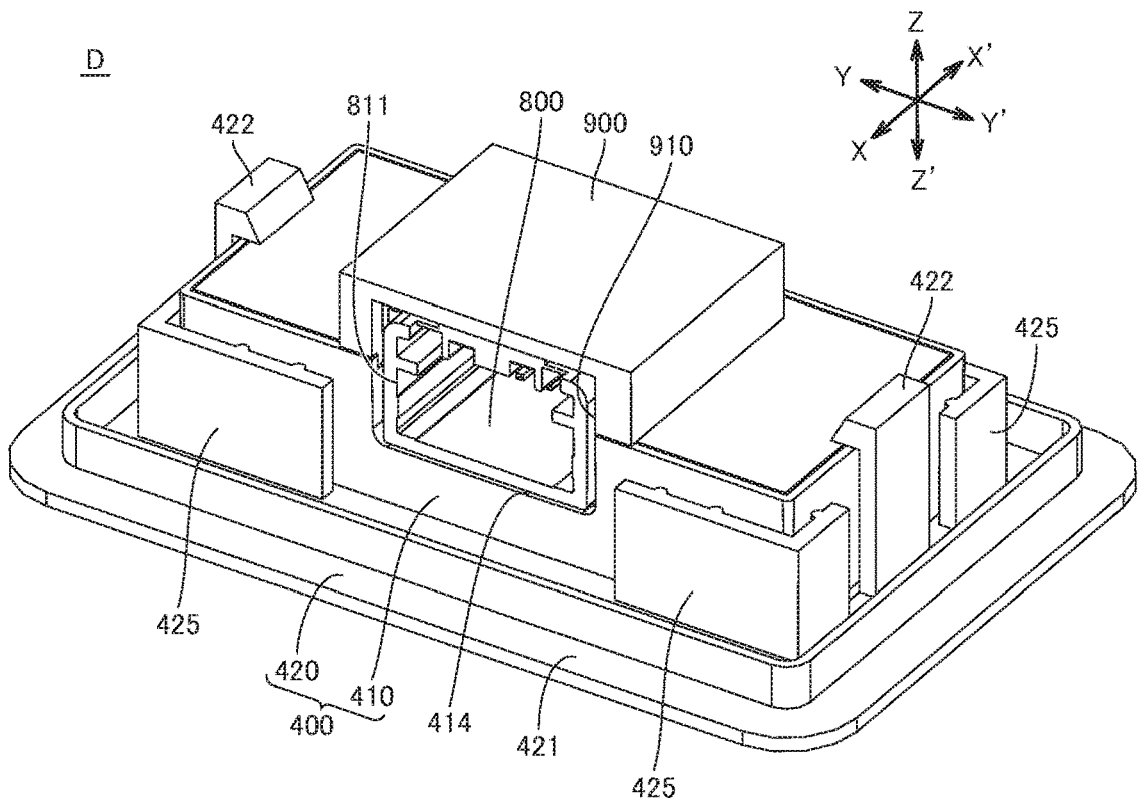
FIG. 4A is a front, top, left side perspective view of an electronic component assembly of the combination.
Figure 4B:
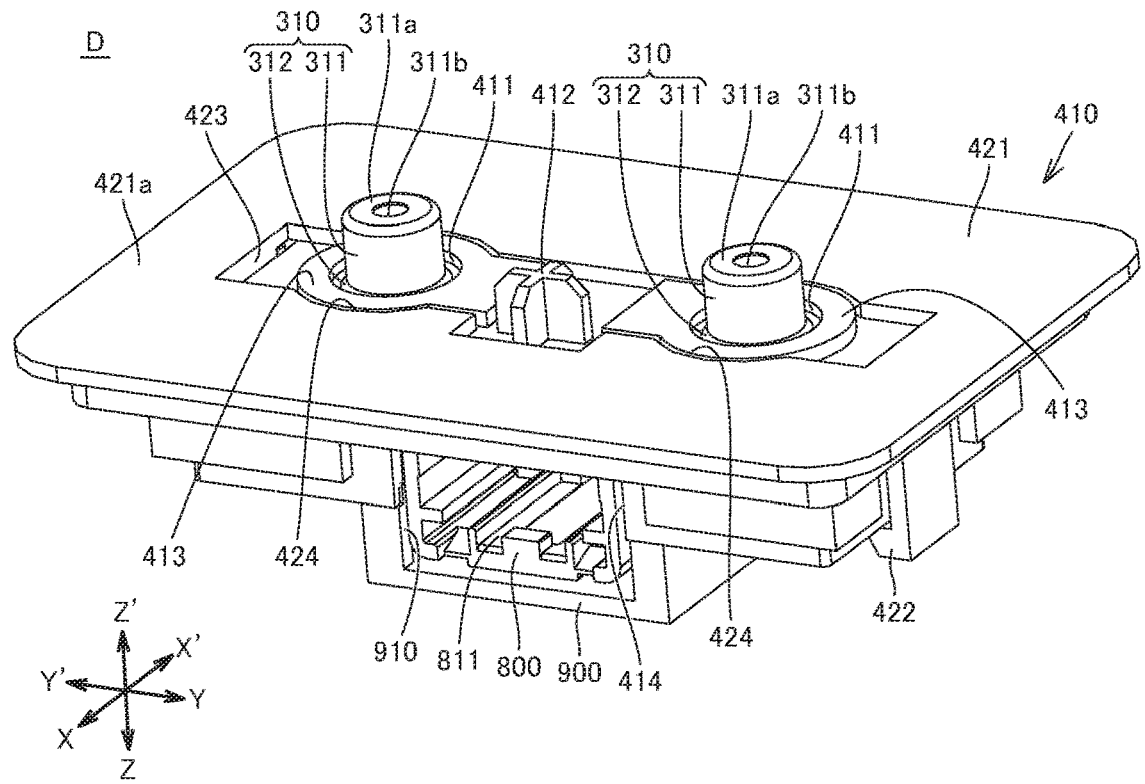
FIG. 4B is a front, bottom, right side perspective view of the electronic component assembly of the combination.
Figure 5A:
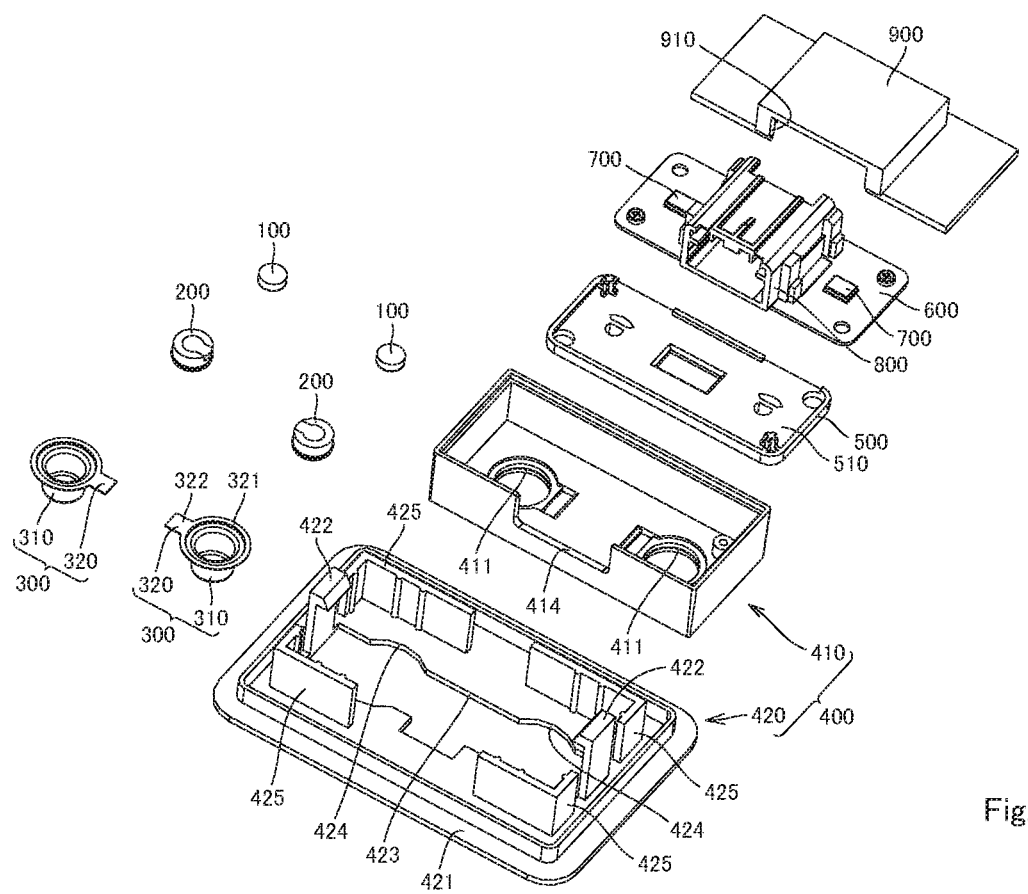
FIG. 5A is an exploded, front, top, left side perspective view of the electronic component assembly of the combination.
Figure 5B:
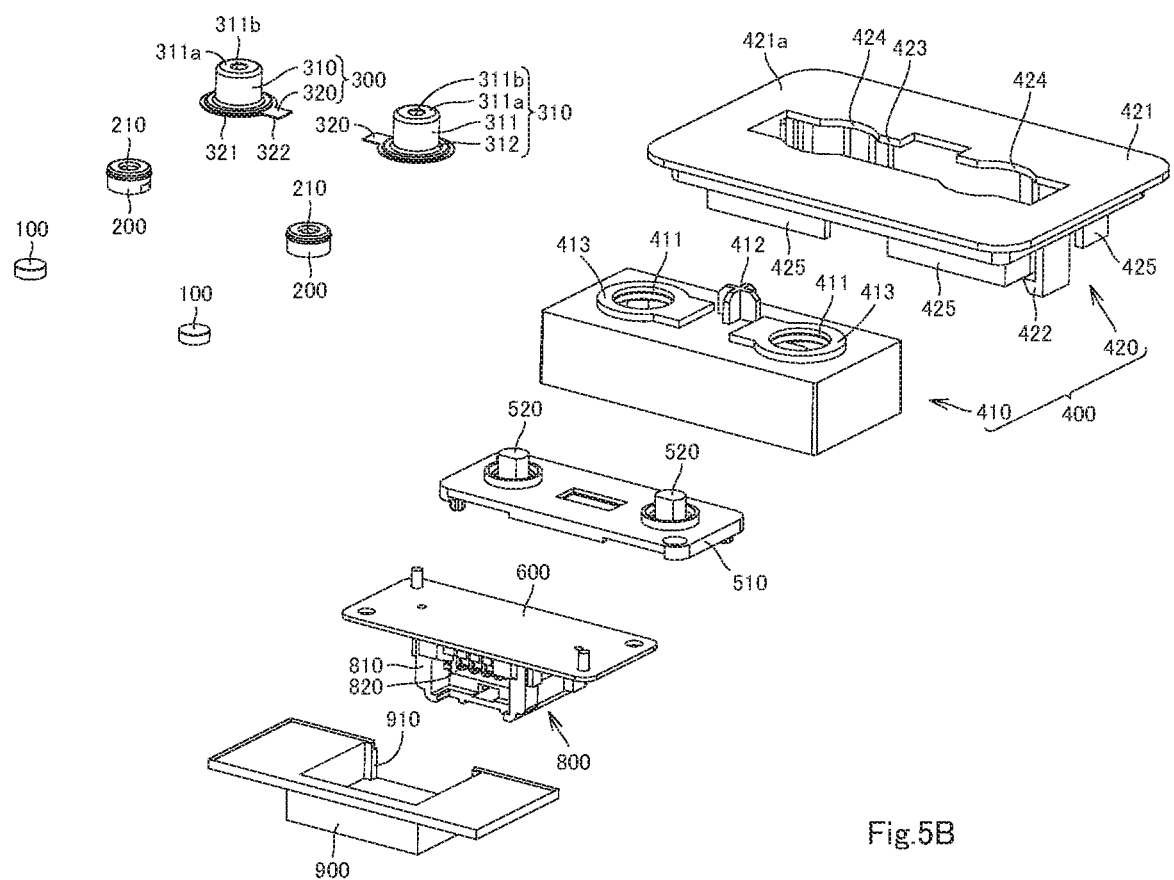
FIG. 5B is an exploded, rear, bottom, left side perspective view of the electronic component assembly of the combination.

The combination S may include a lining H of a ceiling part of a vehicle, and an electronic component assembly D, which may be referred to hereinafter as the headliner H and the assembly D, respectively. In this case, the headliner H includes the adherend 10. The Z-Z' direction as shown in FIGS. 2A to 2C, and 4A and 4B may correspond to a thickness direction of the adherend 10. The Z-Z' direction includes Z and Z' directions respectively corresponding to the first and second directions and being opposite to each other. The Y-Y' direction as shown in FIGS. 2A, and 4A to 4B is substantially orthogonal to the Z-Z' direction. The X-X' direction as shown in in FIGS. 2B to 2C and 4A to 4B is substantially orthogonal to the Z-Z' and Y-Y' directions.

The adherend 10 may be a molded plastic article. The adherend 10 includes a first main face on a Z-direction side and a second main face on a Z'-direction side. The first main face may be provided with a recess 11 opening in the Z direction. In this case, the bottom face of the recess 11 may serve as a first face 11a of the adherend 10. Where the recess 11 is not provided, the first main face itself may serve as the first face 11a of the adherend 10.

The second main face may serve as a second face 12 of the adherend 10. The second main face may also be provided with a recess (not illustrated) opening in the Z' direction. In this case, the bottom face of the recess may serve as the second face 12 of the adherend 10.

The adherend 10 further includes at least one housing hole 13. The or each housing hole 13 may be a through-hole extending from the first face 11a to the second face 12 and opening in the Z and Z' directions. Alternatively, the or each housing hole 13 may be a blind hole in the first face 11a, opening in the Z direction and closing on the Z'-direction side. In the embodiment shown in FIGS. 1A to 3, the adherend 10 has two housing holes 13, which are through-holes spaced from each other along the Y-Y' direction.

The adherend 10 may further include at least one positioning hole 14. The or each positioning hole 14 may be a through-hole extending from the first face 11a to the second face 12 and opening in the Z and Z' directions. Alternatively, the or each positioning hole 14 may be a blind hole in the first face 11a, opening in the Z direction and closing on the Z'-direction side. In the embodiment shown in FIGS. 1A to 3, there is provided one positioning hole 14, which is a through-hole located between the two housing holes 13.

The headliner H may further include a cushioning material 20. The cushioning material 20 has a face on the Z-direction side and a face on the Z'-direction side. The face on the Z-direction side of the cushioning material 20 is bonded to the second face 12 of the adherend 10. Where the at least one housing hole 13 and/or the at least one positioning hole 14 of the adherend 10 is a through-hole or through-holes, the through-hole or through-holes are closed from the Z'-direction side by the cushioning material 20. The cushioning material 20 may be omitted.

The headliner H may further include a cloth 30 made of fabric or the like material. The cloth 30 is bonded to the face on the Z'-direction side of the cushioning material 20. Where the cushioning material 20 is omitted, the cloth 30 may be bonded to the second face 12 of the adherend 10. Where the cushioning material 20 is omitted and the at least one housing hole 13 and/or the at least one positioning hole 14 of the adherend 10 is a through-hole or through-holes, the through-hole or through-holes are closed from the Z'-direction side by the cloth 30. The cloth 30 may also be omitted.

The assembly D includes at least one electronic component 100 (one or a plurality of electronic components 100). The number of the at least one electronic component 100 may be in accordance with the number of the at least one housing hole 13. The or each of the electronic components 100 may be an acoustic component, such as a microphone or a speaker. The microphone includes an input part, such as a sound hole, for receiving audio signals. The speaker includes an output part for outputting audio signals from a speaker.

The assembly D may further include at least one holder 200 (one or a plurality of holders 200). The number of the at least one holder 200 may be in accordance with the number of the at least one electronic component 100. The or each holder 200 is constituted by an elastic body of rubber or other material. The or each holder 200 has such a shape as to accommodate the or a respective electronic component 100. For example, the or each holder 200 may be a case for housing the or a respective electronic component 100 and have inner dimensions that are substantially equal to, or slightly smaller than, the outer dimensions of the or a respective electronic component 100. In this case, the or each electronic component 100 are fittingly received in the or a respective holder 200. The or each holder 200 may have at least one through-hole 210 at a portion on the Z'-direction side facing the input part or the output part of the or a respective electronic component 100. The at least one through-hole 210 may be omitted.

The assembly D further includes at least one housing 300 (one or a plurality of housings 300). The number of the at least one housing 300 may be in accordance with the number of the at least one electronic component 100. The or each housing 300 includes a housing body 310 and a fixed portion 320. For example, the housing body 310 may be of a generally tubular shape having a circular cross-section (see FIGS. 5A and 5B) or a polygonal cross-section (not illustrated). The housing body 310 may open in the Z direction and include a bottom 311a on the Z'-direction side.

Where the at least one holder 200 is provided, the housing body 310 of the or each housing 300 may house the or a respective electronic component 100 and the or a respective holder 200 in a manner (1) or (2) below.

(1) In a cross section along the Y-Y' direction, the or each housing body 310 has inner dimensions that correspond to the outer dimensions of the or a respective holder 200. The or each holder 200 fits in, and is held inside, the or a respective housing body 310. In this case, the or each holder 200 may abut the bottom 311a of the or a respective housing body 310, and the or each electronic component 100 held by the or a respective holder 200 may be in indirect abutment, via the or a respective holder 200, with the bottom 311a of the or a respective housing body 310 from the Z-direction side. Alternatively, the or each holder 200 may be out of abutment with, and held in air inside, the or a respective housing body 310. In this case, the or each housing body 310 may be provided without the bottom 311a.

(2) In a cross section along the Y-Y' direction, the or each housing body 310 has inner dimensions that are larger than the outer dimensions of the or a respective holder 200. The or each housing body 310 houses the or a respective electronic component 100 and holder 200. In this case, as described above, the or each electronic component 100 held by the or a respective holder 200 is in indirect abutment, via the or a respective holder 200, with the bottom 311a of the or a respective housing body 310 from the Z-direction side.

Where the at least one holder 200 is omitted, the housing body 310 of the or each housing 300 may house the or a respective electronic component 100 as described in a manner (3) or (4) below.

(3) In a cross section along the Y-Y' direction, the or each housing body 310 has inner dimensions that correspond to the outer dimensions of the or a respective electronic component 100. The or each electronic component 100 fits in, and is held inside, the or a respective housing body 310. In this case, the or each electronic component 100 may be in direct abutment with the bottom 311a of the or a respective housing body 310 from the Z-direction side. Alternatively, the or each electronic component 100 may be out of abutment with, and held in air inside, the or a respective housing body 310. In this case, the or each housing body 310 may be provided without the bottom 311a.

(4) In a cross section along the Y-Y' direction, the or each housing body 310 has inner dimensions that are larger than the outer dimensions of the or a respective electronic component 100. The or each housing body 310 houses the or a respective electronic component 100. In this case, the or each electronic component 100 is in direct abutment with the bottom 311a of the or a respective housing body 310 from the Z-direction side.

The bottom 311a of the or each housing body 310 may be provided with at least one through-hole 311b. The at least one through-hole 311b extends through the bottom 311a in the Z-Z' direction. Where the at least one holder 200 is provided, the through-hole 311b of the or each housing 300 communicates with the through-hole or through-holes 210 of the holder 200, or alternatively each of the through-holes 311b of the or each housing 300 communicates with the through-hole or through-holes 210 of the or a respective holder 200. Where the at least one holder 200 is omitted, the at least one through-hole 311b of the or each housing body 310 faces the input or output part of the or a respective electronic component 100. The bottom 311a of the or each housing body 310 may be a circular or polygonal plate with no through-holes 311b.

The housing body 310 of the or each housing 300 includes a first portion 311 and a second portion 312. The or each first portion 311 may be of a generally tubular shape (having a circular or polygonal cross-section, for example), and may include the aforementioned bottom 311a on the Z'-direction side of the housing body 310. The or each first portion 311 is housed in the or a respective housing hole 13 of the adherend 10 without protruding from the housing hole 13 in the Z' direction. As such, the or each first portion 311 has a dimension in the Z' direction (corresponding to a dimension in the second direction) equal to, or smaller than, the dimension in the Z' direction of the or a respective housing hole 13. Also, in a cross section along the Y-Y' direction, the or each first portion 311 has outer dimensions that are equal to, or smaller than, the inner dimensions of the or a respective housing hole 13. The or each second portion 312 is generally of a tubular shape (having a circular or polygonal cross-section, for example) extending in the Z direction from the first portion 311 of the or a respective housing body 310. The or each second portion 312 protrudes in the Z direction from the or a respective housing hole 13 with the or a respective first portion 311 housed in the or a respective housing hole 13. The or each second portion 312 may be omitted. The or each bottom 311a may also be omitted as discussed above.

In the or each housing 300, the fixed portion 320 is a flange and/or a piece member extending from the second portion 312 or the first portion 311 of the housing body 310 to be located in the Z direction relative to the first portion 311 of the housing body 310. In the embodiment shown in FIGS. 2A to 2C, and 5A to 5B, the fixed portion 320 of each housing 300 includes a flange 321 of an annular shape, which extends outwardly from the rim on the Z-direction side of the second portion 312 of the housing body 310, and a piece member 322, which extends from the flange 321.

The or each housing 300 may be formed of a drawn thin plate of a metal (e.g., stainless steel). The thin plate may preferably, but not limited to, have a wall thickness of 0.5 mm or less. Alternatively, the or each housing 300 may be formed of a thin metal plate or a plastic member formed by casting or using a 3D printer.

The assembly D further includes a fixing part 400. The fixing part 400 is configured to allow the fixed portion 320 of the or each housing 300 to be fixed to the fixing part 400. The fixing part 400 is fixed (bonded or welded) to the first face 11a of the adherend 10. The fixing part 400 is disposed on the first face 11a of the adherend 10. Where the adherend 10 includes the recess 11, the fixing part 400 may be housed at least partly in the recess 11. The fixing part 400 may include a first fixing part 410 and a second fixing part 420 as described below.

The first fixing portion 410 is configured to allow the fixed portion 320 of the or each housing 300 to be fixed to the first fixing portion 410. For example, the first fixing part 410 may be a molded plastic article, or part thereof, in which the fixed portion 320 of the or each housing 300 is insert-molded, or alternatively be a member of plastic or other material having a groove or hole to receive the fixed portion 320 of the or each housing 300. The first fixing part 410 may include at least one hole 411 (see FIGS. 2A, 2C, and 5A to 5B). In this case, the number and position of the at least one hole 411 of the first fixing portion 410 is in accordance with those of the at least one housing 300. The or each hole 411 leaves open, in the Z direction, the opening on the Z-direction side of the housing body 310 of the or a respective housing 300.

In the embodiment of FIGS. 1A to 2C, and 4A to 5B, the first fixing part 410 is a box opening in the Z direction, having a bottom and a generally tubular wall extending from the bottom in the Z direction. The bottom is provided with two holes 411 spaced from each other along the Y-Y' direction to leave open the corresponding openings on the Z-direction side of the housing bodies 310 of the two housings 300. In portions of the bottom that surround the respective holes 411, the respective fixed portions 320 of the two housing 300 are insert-molded in spaced relation from each other in the Y-Y' direction.

Where at least one hole 411 is omitted, the first fixing part 410 may be a plate or block, to which the fixed portion 320 of the housing body 310 of the or each housing 300 is fixed. Such first fixing part 410 may close or may not close the opening on the Z-direction side of the or each housing body 310.

The first fixing part 410 may further include at least one first protrusion 412 extends in the Z' direction. The at least one first protrusion 412 may be provided as one or more first protrusions 412 in accordance with the number of the at least one positioning hole 14 of the adherend 10. The or each first protrusion 412 is fittingly received in the or a respective positioning hole 14. Thus, the or each first protrusion 412 has dimensions in the Y-Y' and X-X' directions that are substantially equal to, slightly larger than, or slightly smaller than, the dimensions in the Y-Y' and X-X' directions of the corresponding positioning hole 14. In place of the at least one first protrusion 412 and the at least one positioning hole 14, at least one first protrusion may be provided on the adherend 10, and the first fixing part 410 may include at least one positioning hole corresponding in number and position to the at least one first protrusion. The at least one first protrusion and the at least one positioning hole may be omitted.

The first fixing part 410 may fixed to the second fixing part 420 by mechanical engaging, bonding, welding, and/or screwing. For convenience of explanation, one of the second fixing part 420 and the first fixing part 410 is may be referred to hereinafter as one of the fixing parts or one fixing part, and the other as the other fixing part.

Where the first fixing part 410 is attached to the second fixing part 420 by mechanical engagement, one of the fixing parts is provided with at least one engaging claw or engaging protrusion, and the other fixing part includes at least one wall or engaging hole. In this case, the first fixing part 410 is attached to the second fixing part 420 by hooking the or each engaging claw 422 of the one fixing part on an edge of the or a respective wall of the other fixing part, or on an edge of the or a respective engaging hole; or by fitting the or each engaging protrusion of the one fixing part into the or a respective engaging hole of the other fixing part. In the embodiment shown in FIGS. 1A to 2C, and 4A to 5B, the second fixing part 420 includes a base 421 and two arms extending in the Z direction from the base 421. The arms are spaced from each other along the Y-Y' direction. The arms on the Y- and Y'-direction sides are provided at their respective leading ends with respective engaging claws 422. The engaging claws 422 are hooked, from the Z-direction side, on edges on the Z-direction side of the portions on the Y- and Y'-direction sides of the tubular wall of the first fixing part 410.

The second fixing part 420 is fixed to the first face 11a of the adherend 10 by bonding or welding. The second fixing part 420 includes a base 421 having a mounting face 421a to be mounted on the first face 11a of the adherend 10. The mounting face 421a is the face on the Z'-direction side of the base 421 of the second fixing part 420. The first fixing part 410 is disposed on (the Z-direction side of) the base 421 of the second fixing part 420. The base 421 of the second fixing part 420 includes at least one opening 423 or cutout for allowing the first portion 311 of the housing body 310 of the or each housing 300 to protrude in the Z' direction relative to the mounting face 421a of the fixing part 400. In other words, the first portion 311 of the housing body 310 of the or each housing 300 extends through the or a respective opening 423 or cutout to be disposed on the Z'-direction side relative to the mounting face 421a of the fixing part 400. Where a single opening 423 or a single cutout is provided, the opening 423 or cutout may be configured to receive therethrough the housing body 310 of the or each housing 300 (see FIGS. 1A to 2C and 4A to 5B). Alternatively, where a plurality of openings 423 or cutouts is provided, the openings 423 or cutouts may be arranged in the second fixing part 420 at positions corresponding to the respective housing bodies 310 of a plurality of housings 300.

Where the first fixing part 410 includes the at least one first protrusion 412, the at least one first protrusion 412 may be inserted through the at least one opening 423 or cutout and protrude in the Z' direction relative to the mounting face 421a.

The one fixing part may further include at least one second protrusion 413, and the other fixing part may further include at least one positioning hole 424. The at least one second protrusion 413 may extend from the one fixing part toward the other fixing part. The at least one positioning hole 424 of the other fixing part correspond in number and position to the at least one second protrusion 413. The or each second protrusion 413 is fittingly received in the or a respective positioning hole 424, so that the first fixing part 410 is fixed in position to the second fixing part 420. Accordingly, the or each positioning hole 424 has a cross-sectional dimension in the Y-Y' direction that is equal to, or slightly larger or slightly smaller than, the cross-sectional dimension in the Y-Y' direction of the or a respective second protrusion 413. In the embodiment of FIGS. 2A, 2C, and 5A to 5B, the first fixing part 410 includes two second protrusions 413, which are ring-shaped protrusions surrounding the respective two holes 411, while the single opening 423 in the second fixing part 420 includes two positioning holes 424 corresponding in shape and position to the second protrusions 413. The at least one second protrusion 413 and the at least one positioning hole 424 may be omitted.

The second fixing part 420 may further include at least one positioning portion 425. The at least one positioning portion 425 may extend in the Z direction from the base 421 of the second fixing part 420 and surround the first fixing part 410. The at least one positioning portion 425 may abut the first fixing part 410. In the embodiment of FIGS. 1A to 2C and 4B, there are four positioning portions 425 being generally L-shaped walls, as viewed from the Z-direction side, in abutment with respective corners of the walls of the first fixing part 410. The at least one positioning portion 425 may be omitted.

The assembly D may further include a support 500 and/or a circuit board 600. The support 500 includes a support body 510. The support body 510 is fixed to (the Z-direction side of) the first fixing part 410 in a similar manner to the fixing between the first and second fixing parts 410 and 420. In the embodiment of FIGS. 2A to 2C, and 4A and 4B, the support body 510 is fixed to the bottom (the face on the Z-direction side) of the first fixing part 410, by engagement described above and screwing, and located on the Z-direction side relative to the bottom. The circuit board 600 is fixed to (the Z-direction side of) the support body 510 of the support 500 in a similar manner to the fixing between the first and second fixing parts 410 and 420. Where the support 500 is omitted, the circuit board 600 is fixed to the first fixing part 410 in a similar manner to the fixing between the first and second fixing parts 410 and 420. The one or more electronic components 100 are electrically connected to the circuit board 600 via a connecting means (not shown), such as a cable, cables, or lead wires. Where the circuit board 600 is omitted, the at least one electronic component 100 may be connected via the connection means to the outside.

The support 500 may further include at least one leg 520. The or each leg 520 is a protrusion extending from the support body 510 in the Z' direction. The at least one leg 520 may comprise one or more legs 520 corresponding in number to the at least one housing 300. In this case, the first fixing part 410 may include the at least one hole 411 corresponding in number to the at least one housing 300, and the at least one leg 520 may be arranged correspondingly in position to the at least one hole 411 and the at least one housing 300. Where the at least one holder 200 is provided, the or each leg 520 extends through the or a respective hole 411 to be received in the housing body 310 of the or a respective housing 300 from the Z-direction side, and to be brought into abutment with the or a respective holder 200 in the or a respective housing body 310. In other words, the or each leg 520 is in indirect abutment with the or a respective electronic component 100, via the or a respective holder 200, inside the or a respective housing body 310. Where the at least one holder 200 is omitted, the or each leg 520 extends through the or a respective hole 411 to be received in the housing body 310 of the or a respective housing 300 from the Z-direction side, and to be brought into direct abutment with the or a respective electronic component 100 inside the or a respective housing body 310. The at least one leg 520 of the support 500 may be omitted in cases where the or each housing body 310 holds therein the or a respective holder 200 or the or a respective electronic component 100, or where the opening of the or each housing body 310 is closed.

Where the circuit board 600 is provided, the assembly D may further include at least one circuit part 700 and/or a connector 800 mounted on the circuit board 600. Particularly, there may be provided a single circuit part 700 electrically connected to one or more electronic components 100 via the circuit board 600. Alternatively, there may be provided a plurality of circuit parts 700, which may be electrically connected to the corresponding electronic components 100 via the circuit board 600. If provided, the connector 800 includes a body 810 and a plurality of terminals 820. The body 810 is made of an insulating resin and has a connection hole 811. Each terminal 820 includes a contact portion disposed in the connection hole 811, a connection portion protruding out of the body 810 to be soldered to the circuit board 600. The connector 800 is electrically connected to the at least one circuit part 700 and/or to the at least one electronic component 100 via the circuit board 600. The at least one circuit part 700 and/or the connector 800 may be omitted.

Where the first fixing part 410 is a box opening in the Z direction, the assembly D may further include a cover 900. The cover 900 is attached to the tubular wall of the first fixing part 410 from the Z-direction side and closes the opening of the first fixing part 410 from the Z-direction side. Where the connector 800 is provided, the cover 900 is provided with a housing recess 910 opening in the Z' and X directions. The housing recess 910 houses a portion on the Z-direction side of the body 810 of the connector 800 and leave the connection hole 811 of the connector 800 open in the X direction. In the embodiment of FIGS. 1A to 2C, and 4A and 4B, the engaging claws 422 of the respective arms on the Y- and Y'-direction sides of the second fixing part 420 are hooked, from the Z-direction side, not only on the edges on the Z-direction side of the respective portions on the Y- and Y'-direction sides of the tubular wall of the first fixing part 410, but also on the end portions on the Y- and Y'-direction sides of the cover 900. This arrangement maintains secure attachment of the cover 900 to the tubular wall of the first fixing part 410. The portion on the X-direction side of the tubular wall of the first fixing part 410 is provided with a cutout 414, which leaves the connection hole 811 of the connector 800 open in the X direction. The cover 900 may be omitted.

The following describes first and second methods for mounting the at least one electronic component 100 to the adherend 10. For convenience description, the first method will be described for the case where there are provided a single electronic component 100, a single holder 200, a single housing 300, a single opening 423 or cutout of the fixing part 400, and a single leg 520 of the support 500. However, it is also possible to assemble the assembly D in a similar manner by the first method also in the case where there are provided a plurality of electronic components 100, a plurality of holders 200, a plurality of housings 300, a plurality of openings 423 or cutouts of the fixing part 400, and a plurality of legs 520 of the support 500. Also, the second method will be described for the case where there are provided a single electronic component 100, a single holder 200, a single housing 300, and a single opening 423 or cutout of the fixing part 400. However, it is also possible to assemble the assembly D in a similar manner by the second method also in the case where there are provided a plurality of electronic components 100, a plurality of holders 200, a plurality of housings 300, and a plurality of openings 423 or cutouts of the fixing part 400. The second method deals with the assembly D with the support 500 omitted.

The first and second methods each include a method for assembling the assembly D and a method for mounting the assembly D to the adherend 10. As the first and second methods are similar to each other regarding the mounting of the assembly D to the adherend 10, the second method will not be described in this regard.

First, the following description is directed to the method for assembling the assembly D of the first method. The electronic component 100 and the holder 200 holding the electronic component 100 are prepared. The first fixing part 410 of the fixing part 400 and the housing 300 fixed to the first fixing part 410 are also prepared. The electronic component 100 and the holder 200 are housed in the housing body 310 of the housing 300. The holder 200 is then brought into abutment with the bottom 311a of the housing body 310. The support 500 is also prepared. The support body 510 of the support 500 is fixed to the first fixing part 410 in a manner described above. The leg 520 of the support 500 is then inserted into the housing body 310 and brought into abutment with the holder 200 inside the housing body 310. As a result, the holder 200 and the electronic component 100 are sandwiched between the bottom 311a of the housing body 310 and the leg 520. The electronic component 100 and the holder 200 are thus held inside the housing 300 fixed to the first fixing part 410.

Where the holder 200 is omitted, the above steps in the previous paragraph may be modified as follows. The electronic component 100 is housed in the housing body 310 of the housing 300, and that the electronic component 100 is brought into abutment with the bottom 311a of the housing body 310. The leg 520 of the support 500 is inserted into the housing body 310 and brought into abutment with the electronic component 100 inside the housing body 310. As a result, the electronic component 100 is sandwiched between the bottom 311a of the housing body 310 and the leg 520. The electronic component 100 is thus held inside the housing 300 fixed to first fixing part 410.

Before or after the electronic component 100 and the holder 200, or the electronic component 100, is held in the housing 300, the second fixing part 420 of the fixing part 400 is prepared. The housing body 310 of the housing 300 fixed to the first fixing part 410 is inserted through the opening 423 or cutout of the second fixing part 420, and the first portion 311 of the housing body 310 is made to protrude in the Z' direction, relative to the mounting face 421a of the second fixing part 420. The first fixing part 410 is then fixed to the second fixing part 420 in a manner as described above.

Where the first fixing part 410 includes the at least one first protrusion 412, when the first fixing part 410 is fixed to the second fixing part 420, the or each first protrusion 412 is inserted through the or a respective opening 423 cutout and protrudes in the Z' direction. Where one of the fixing parts, namely the first fixing part 410 or the second fixing part 420, includes the at least one second protrusion 413 and where the other fixing part further includes the at least one positioning hole 424, when the first fixing part 410 is fixed to the second fixing part 420, the or each second protrusion 413 fits into the or a respective positioning hole 424.

Where the assembly D includes the circuit board 600, the circuit board 600 may be prepared, before the support body 510 is fixed to the first fixing part 410, and then fixed to the support body 510 of the support 500 in a manner as described above. The circuit board 600 may be electrically connected to the at least one electronic component 100 via the above-described connection means before or after the circuit board 600 is fixed to the support body 510. The circuit board 600 to be prepared may or may not be provided thereon with the least one circuit part 700 and/or the connector 800. Where the circuit board 600 is omitted, the steps in this paragraph are omitted.

Where the first fixing part 410 is a box opening in the Z direction and the assembly D includes the cover 900, before the first fixing part 410 is fixed to the second fixing part 420, the cover 900 is attached to the tubular wall of the first fixing part 410 and closes the opening of the first fixing part 410. Where the connector 800 is mounted on the circuit board 600, after the support body 510 is fixed to the first fixing part 410 and the circuit board 600 is fixed to the support body 510, the cover 900 is attached to the tubular wall of the first fixing part 410 as described above and a part on the Z-direction side of the connector 800 is housed in the housing recess 910 of the cover 900. When the first fixing part 410 is fixed to the second fixing part 420, the engaging claws 422 on the Y and Y'-direction sides of the second fixing part 420 are hooked, from the Z-direction side, not only on the edges on the Z-direction side of the portions on the Y- and Y'-direction sides of the tubular wall of the first fixing part 410, and also on the corresponding end portions on the Y- and Y'-direction sides of the cover 900. Where the cover 900 is omitted, the steps in this paragraph are omitted. Where the connector 800 is not mounted on the circuit board 600, the step of housing the part on the Z-direction side of the connector 800 in the housing recess 910 of the cover 900 is omitted.

The assembly D is thus assembled in one of the manners described above.

The following description is directed to the method for mounting the assembly D to the adherend 10 of the first method. If provided, the cushioning material 20 and/or the cloth 30 may be bonded to the adherend 10 either before or after mounting the assembly D to the adherend 10.

The adherend 10 and the assembly D assembled are prepared. The mounting face 421a of the second fixing part 420 of the assembly D is placed on the first face 11a of the adherend 10. At this time, the first portion 311 of the housing body 310 of the assembly D is inserted into the housing hole 13 of the adherend 10. Where the first fixing part 410 of the assembly D includes the at least one first protrusion 412 and where the adherend 10 includes the at least one positioning hole 14, when the mounting face 421a of the second fixing part 420 is placed on the first face 11a of the adherend 10, the or each first projection 412 fits into the or a respective positioning hole 14, so that the assembly D is positioned relative to the adherend 10.

The second fixing part 420 of the assembly D placed on the first face 11*a* of the adherend 10 is fixed to the first face 11*a* by bonding or welding. The assembly D is thus attached to the adherend 10.

The following description is directed to the method for assembling the assembly D of the second method. This method is similar to, but different in respects below from, the method for assembling the assembly D of the first method, and therefore will be described focusing on the differences.

When the electronic component 100 and the holder 200 are housed inside the housing body 310 of the housing 300, the holder 200 is fitted in, and held by, the housing body 310. In this way, the electronic component 100 and the holder 200 are held inside the housing 300 fixed to the first fixing part 410.

Where the holder 200 is omitted, the electronic component 100 is housed in the housing body 310 of the housing 300 when the electronic component 100 is fitted in, and held by, the housing body 310. In this way, the electronic component 100 is held inside the housing 300 fixed to the first fixing part 410.

Where the assembly D includes the circuit board 600, the circuit board 600 may be fixed to the first fixing part 410 in a manner described above after the electronic component 100 and the holder 200, or alternatively the electronic component 100, is held inside the housing 300. The circuit board 600 may be electrically connected to the electronic component 100 via a connection means described above, either before or after the circuit board 600 is fixed to the first fixing part 410. The circuit board 600 may be prepared with or without the at least one circuit part 700 and/or the connector 800 mounted thereon. Where the circuit board 600 is omitted, the steps in this paragraph should be omitted.

The first and second methods may be such that, as described above, the assembly D is attached to the adherend 10 after the assembly D is assembled, but the first and/or second methods may be modified in the order of the steps as follows. The second fixing part 420 may be fixed to the first face 11*a* of the adherend 10 before the electronic component 100 and the holder 200, or alternatively the electronic component 100, is held inside the housing 300 fixed to the first fixing part 410. After that, the first fixing part 410 with the housing 300 may be fixed to the second fixing part 420, and then the electronic component 100 and the holder 200, or alternatively the electronic component 100, may be held inside the housing 300 fixed to the first fixing part 410.

The combination S, the assembly D, and the first and second methods described above provide at least the following technical features and effects.

(a) No part of the assembly D is disposed on the second face 12 side of the adherend 10 (no part of the assembly D is located on the Z'-direction side relative to the second face 12 of the adherend 10). This is because the fixing part 400 of the assembly D is only bonded or welded to the first face 11*a* of the adherend 10, and because the first portion 311 of the housing body 310 of the or each housing 300 of the assembly D is housed in the correspondence housing hole 13 in the adherend 10 without protruding in the Z' direction from the second face 12 of the adherend 10.

In particular, where the at least one housing 300 is formed of a thin metal plate, it is possible to reduce the thickness of the housing 300 while ensuring a predetermined strength of the housing 300. This makes it easy to reduce the dimension in the Z-Z' direction of the first portion 311 of the housing body 310 of the or each housing 300. Therefore, the first portion 311 of the or each housing 300 can be housed easily in the or a respective housing hole 13 of the adherend 10 without protruding in the Z' direction from the second face 12 of the adherend 10.

Where the or each housing hole 13 of the adherend 10 is a blind hole opening in the Z direction, the first portion 311 of the or each housing body 310 in the corresponding housing hole 13 will not be seen through the cushioning material 20 and/or the cloth 30 by a user from the Z' direction.

(b) Where sandwiched between the bottom 311*a* of the or a respective housing 300 and the corresponding leg 520 of the support unit 500, the or each electronic component 100 and the or each holder 200, or alternatively the or each electronic component 100, can be easily fixed, simply by such sandwiching, in position inside the or a respective housing 300. In addition, the or each electronic component 100 and the or each holder 200, or alternatively the or each electronic component 100, is only sandwiched in the above manner. This sandwiching condition can be released simply by detaching the support body 510 of the support 500 from the first fixing part 410 to allow easy replacement of the at least one electronic component 100.

The bottom 311*a* of the or each housing 300 is located on the Z'-direction side relative to the audio signal input part or the audio signal output part of the or a respective electronic component 100. If the bottom 311*a* of the or each housing 300 is of a large thickness, the thickness may impair acoustic characteristics of the corresponding electronic component 10. However, where the or each housing 300 is formed of a thin metal plate to include the bottom 311*a* of a small thickness, the thickness is unlikely to impair the acoustic characteristics of the corresponding electronic component 100. For example, where the or each electronic component 100 is a microphone, a large thickness of the bottom 311*a* would cause reduction of sound pressure in a high frequency range of sounds to be picked up by the microphone, but the small thickness of the bottom 311*a* alleviates reduction of sound pressure in a high frequency range of sounds to be picked up by the microphone.

(d) Where the or each electronic component 100 is held by the or a respective holder 200 being an elastic body, the or each holder 200 absorbs and thereby reduces vibrations subjected to the or a respective electronic component 100.

(e) When the first fixing part 410 of the fixing part 400 includes a plurality of first protrusions 412 and the adherend 10 includes a plurality of positioning holes 14, position and orientation of the assembly D relative to the adherend 10 can be easily determined by inserting the first protrusions 412 into the corresponding positioning holes 14.

Second Embodiment

Hereinafter described is a combination S' of an electronic component assembly D' and an adherend 10 (this combination may be referred to simply as a combination S') according to a plurality of embodiments of the invention, including a second embodiment, with reference to FIGS. 6A to 8. These figures illustrate the combination S' of the second embodiment. The combination S' may include a lining H of a ceiling of a vehicle, and an electronic component assembly D', which may be referred to hereinafter as the headliner H and the assembly D', respectively. The Z-Z' direction shown in FIGS. 6A to 6C and 8, the X-X' direction shown in FIGS. 6B to 6D and 8, and the Y-Y' direction shown in FIGS. 6A, 6D, and 8 may be defined in a similar manner to the Z-Z', X-X', Y-Y' directions, respectively, of the first embodiment defined above.

the assembly D' differs from the assembly D of the combination S only in that the assembly D' further includes a seal member E but the assembly D does not. The assembly D' of the combination S' will be described focusing on the above difference from the assembly D of the combination S and omitting overlapping descriptions. The headliner H of the combination S' is similar in structure to the headliner H of the combination S.

The seal member E is a thin plate, which may be constituted by rubber foam made of ethylene propylene diene monomer rubber (EPDM rubber) or the like (e.g., EPT-SEALER (registered trademark) available from Nitto Denko Corporation), a double-sided tape, chloroprene rubber (e.g., neoprene sponge), a high-performance urethane foam made of a microcell polymer sheet (e.g., PORON (registered trademark) available from Rogers Inoac Corporation) or the like, for example. The seal member E may, but is not required to, have a thickness in a range from 0.4 to 0.8 mm, for example. For convenience of illustration, FIGS. 6A to 6C, and 8 show the seal member E with an exaggerated thickness.

The seal member E is bonded or otherwise fixed to the face on the Z'-direction side of the fixing part 400. The seal member E is held and compressed between the face on the Z'-direction side of the fixing part 400 and the first face 11a of the adherend 10 of the headliner H.

Where the fixing part 400 includes the first fixing part 410 and the second fixing part 420, the seal member E is bonded or otherwise fixed to at least one of the face on the Z'-direction side of the first fixing part 410 and the mounting face 421a of the second fixing part 420. For example, where the first fixing part 410 includes the at least one second protrusion 413 surrounding the at least one hole 411, the seal member E may be fixed to a portion or portions of the first fixing part 410 that surrounds the at least one second protrusion 413. Alternatively, where the second fixing part 420 includes the at least one positioning hole 424 corresponding in shape and position to the at least one second protrusion 413, the seal member E may be fixed to a portion or portions of the second fixing part 420 that surrounds the at least one positioning hole 424 so as to cover the at least one positioning hole 424. Alternatively, where the first fixing part 410 includes the at least one second protrusion 413 surrounding the at least one hole 411, and where the second fixing part 420 includes the at least one positioning hole 424 corresponding in shape and position to the at least one second protrusion 413, the seal member E may be fixed to a portion or portions of the first fixing part 410 that surrounds the at least one second protrusion 413, and also to a portion or portions of the second fixing part 420 that surrounds the at least one positioning hole 424, so as to cover the at least one positioning hole 424 (see FIGS. 6A to 6D, and 8).

The seal member E includes at least one through-hole E1. The at least one through-hole E1 in the seal member E corresponds in number and position to the at least one housing 300 and extends through the seal member E in the Z-Z' direction. The or each through-hole E1 is shaped so as to have a cross-sectional dimension in the Y-Y' direction that is substantially the same as, or slightly larger than, the cross-sectional outer dimension in the Y-Y' direction of the first portion 311 of the housing body 310 of the or a respective housing 300. The or each through-hole E1 allows the first portion 311 of the housing body 310 of the or a respective housing 300 to be inserted therethrough in the Z' direction. Accordingly, the portion or portions of the seal member E that surround the or each through-hole E1 is located around the first portion 311 of the housing body 310 of the or a respective housing 300.

Where the first fixing part 410 includes the at least one first protrusion 412, the seal member E may further include at least one through-hole E2 disposed corresponding in position to the at least one first protrusion 412. The at least one through-hole E2 extends through the seal member E in the Z-Z' direction. The or each through-hole E2 is shaped so as to have a cross-sectional dimension in the Y-Y' direction that is substantially the same as, or slightly larger than, the outer cross-sectional dimension in the Y-Y' direction of the or a respective first protrusion 412. The or each through-hole E2 allows the corresponding first protrusion 412 to be inserted therethrough in the Z' direction. Accordingly, the portion or portions of the seal member E that surround the or each through-hole E2 is located around the or a respective first protrusion 412. Where the at least one first protrusion 412 is omitted, it is preferable to omit the at least one through-hole E2. Where the at least one first protrusion 412 is arranged around, or outside, the seal member E, the at least one through-hole E2 may be omitted.

Figure 6A:
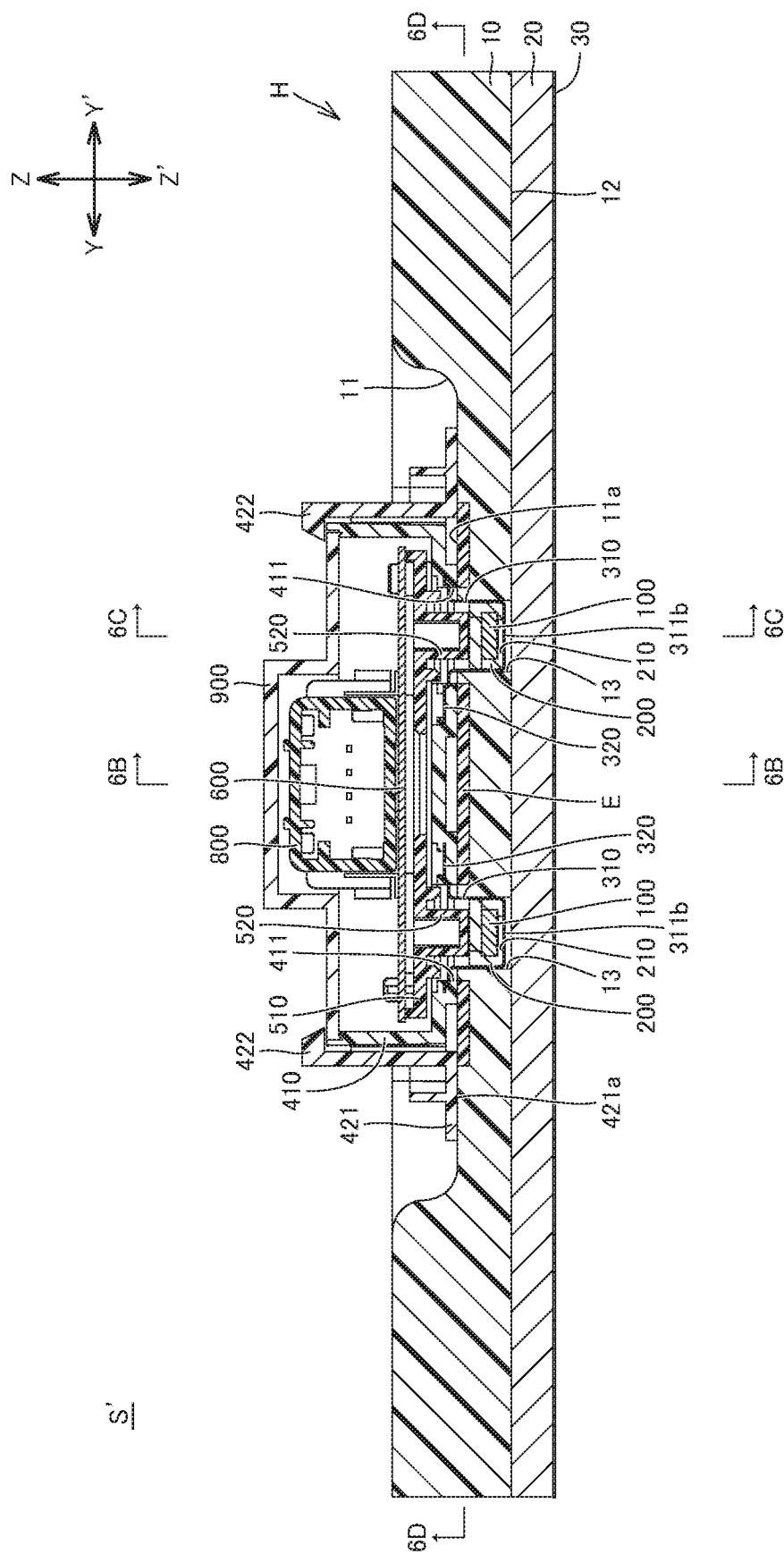
FIG. 6A is a sectional view, corresponding to FIG. 2A, of a combination of an electronic component assembly and an adherend according to a second embodiment of the invention.
Figure 6B:
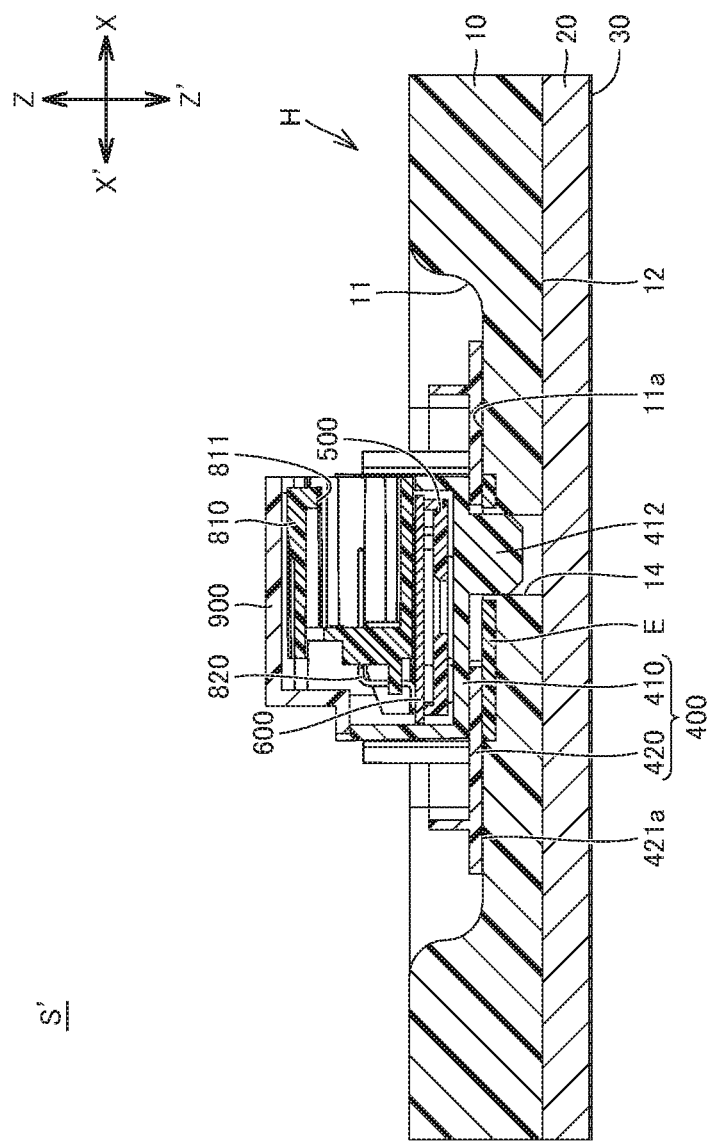
FIG. 6B is a sectional view of the combination, taken along line 6B-6B in FIG. 6A.
Figure 6C:
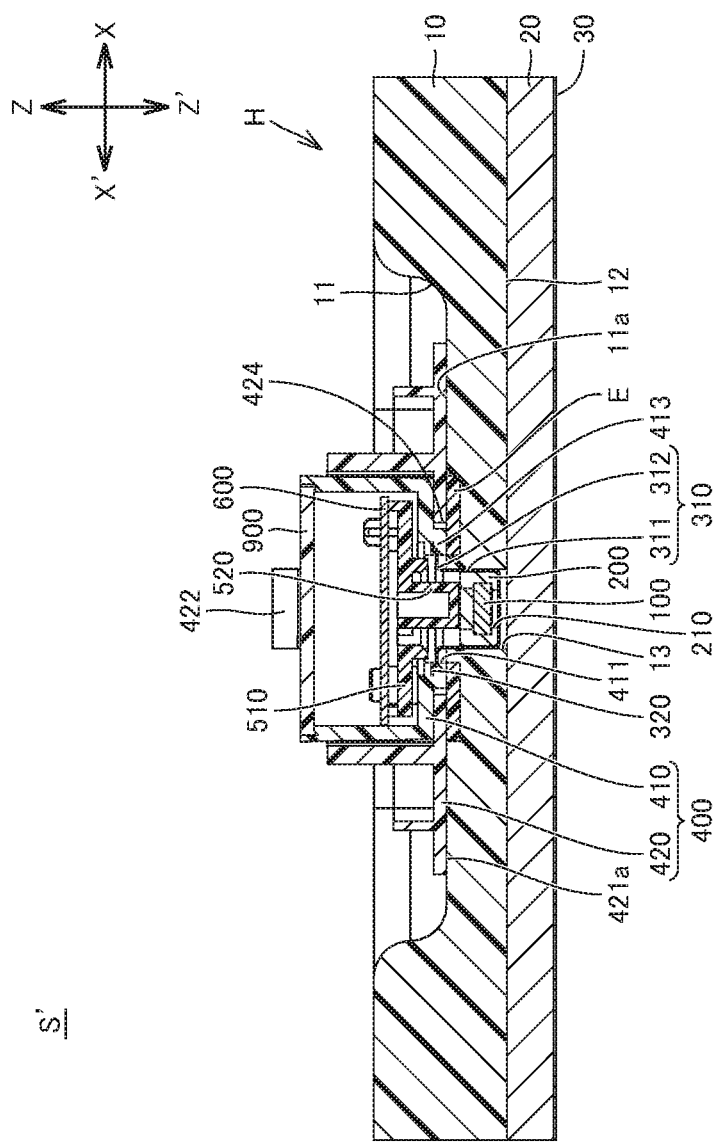
FIG. 6C is a sectional view of the combination, taken along line 6C-6C in FIG. 6A.
Figure 6D:
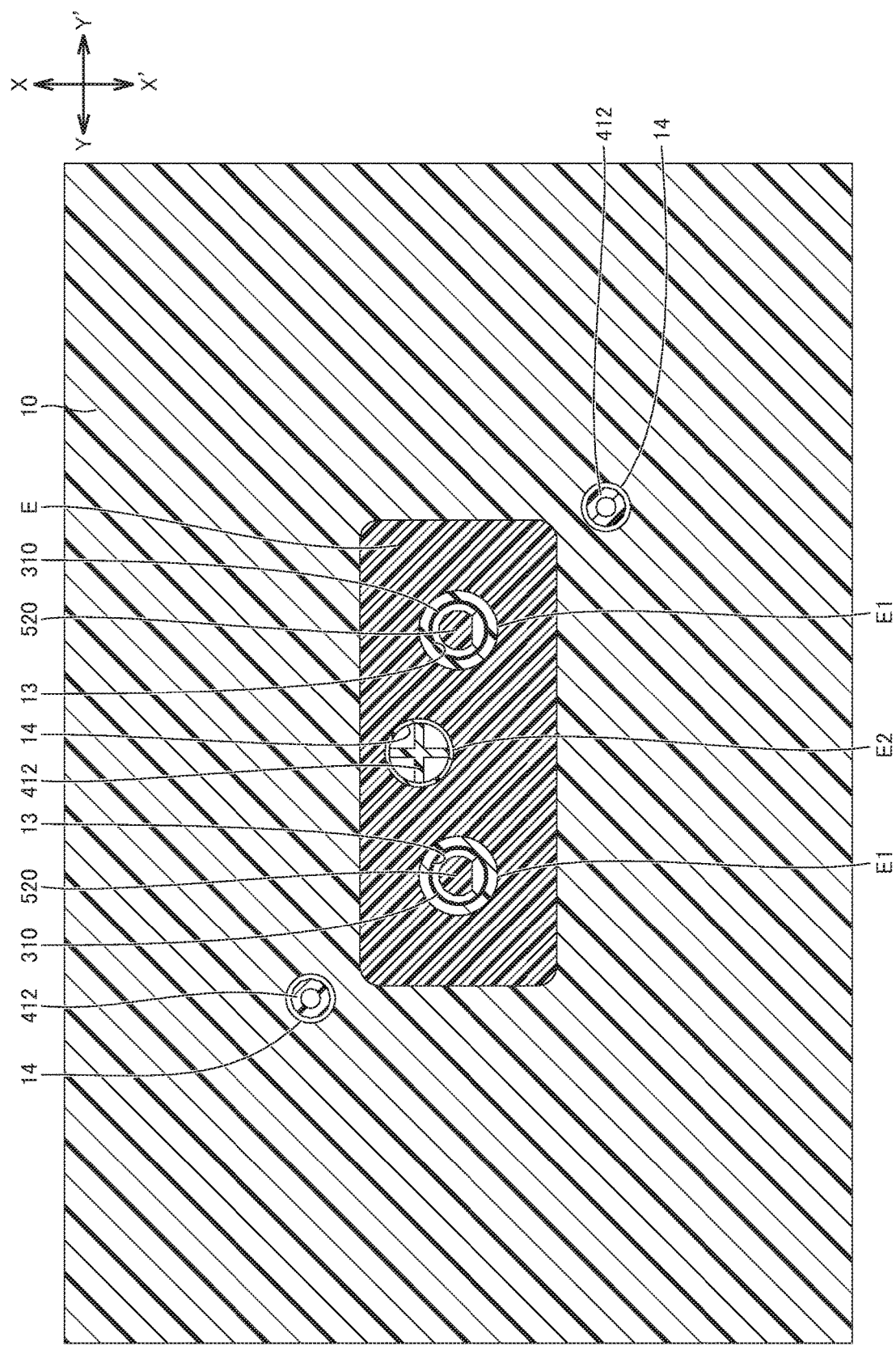
FIG. 6D is a sectional view of the combination, taken along line 6D-6D in FIG. 6A.
Figure 7:
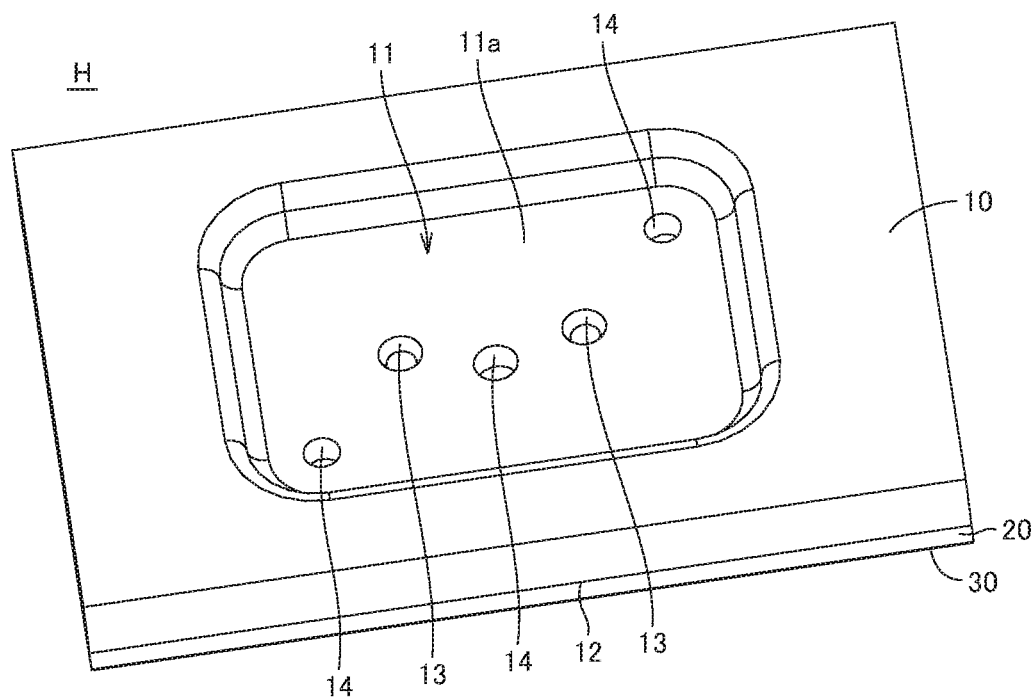
FIG. 7 is a front, top, right side perspective view of an adherend, a cushioning material, and a cloth of the combination.
Figure 8:
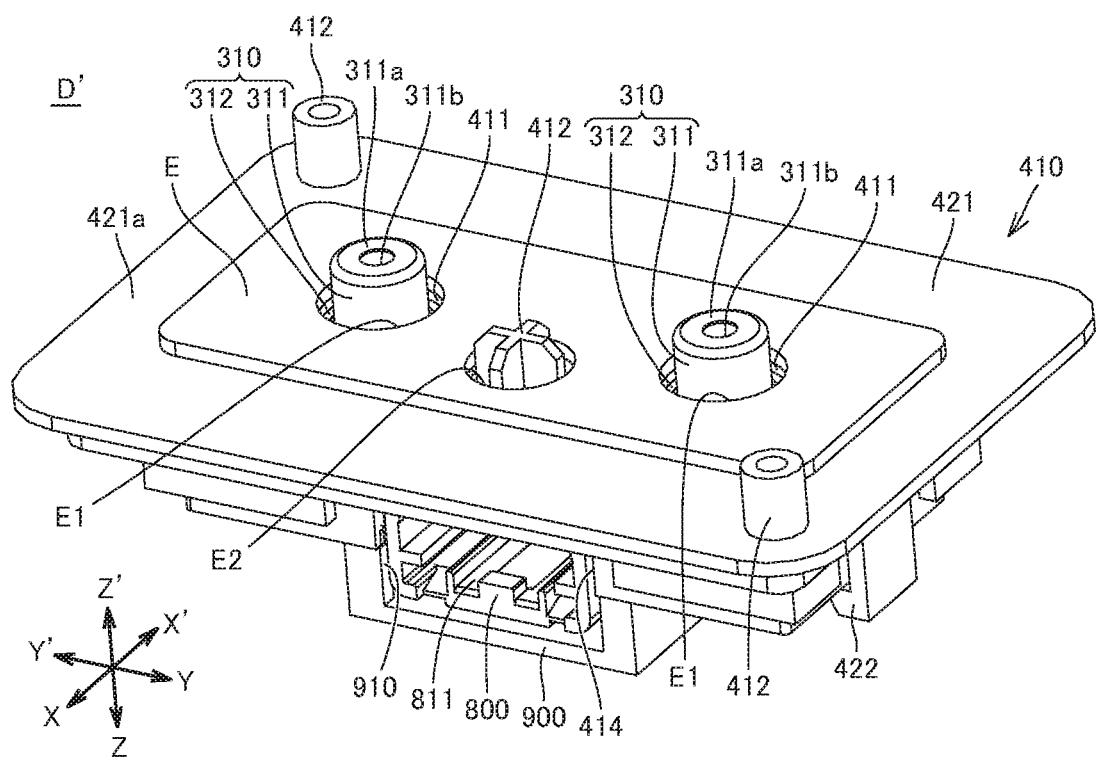
FIG. 8 is a front, bottom, right side perspective view of the electronic component assembly of the combination.

In the embodiment shown in FIGS. 6A to 6D and 8, the first fixing part 410 includes three first protrusions 412, and the seal member E is provided with a single through-hole E2. The three first protrusions 412 consist of a central first protrusions 412, a first protrusion 412 on the Y-direction side relative to (i.e. outside) the seal member E, and a first protrusion 412 on the Y'-direction side relative to (i.e. outside) the seal member E. The through-hole E2 of the seal member E is associated with the central first protrusion 412, and no through-holes E2 are provided in association with the first protrusions 412 on the Y- and Y'-direction sides. Also, in this embodiment, as shown in FIGS. 6D and 7, the adherend 10 of the headliner H has three positioning holes 14 respectively associated with the three first protrusions 412.

The following describes first and second methods for mounting the at least one electronic component 100 to the adherend 10. Here, these first and second methods here each include a method for assembling the assembly D' and a method for mounting the assembly D' to the adherend 10. For convenience description, the first method will be described for the case where there are provided a single electronic component 100, a single holder 200, a single housing 300, a single opening 423 or cutout of the fixing part 400, and a single leg 520 of the support 500. However, it is also possible to assemble the assembly D' in a similar manner by the first method also in the case where there are provided a plurality of electronic components 100, a plurality of holders 200, a plurality of housings 300, a plurality of openings 423 or cutouts of the fixing part 400, and a plurality of legs 520 of the support 500. Also, the second method will be described for the case where there are provided a single electronic component 100, a single holder 200, a single housing 300, and a single opening 423 or cutout of the fixing part 400. However, it is also possible to assemble the assembly D' in a similar manner by the second method also in the case where there are provided a plurality of electronic components 100, a plurality of holders 200, a plurality of housings 300, and a plurality of openings 423 or cutouts of the fixing part 400.

First, the following description is directed to the method for assembling the assembly D' of the first method. The steps of the first for assembling the assembly D' of the first method are the same as those of the method for assembling the assembly D of the first method, except for the following steps.

Where the assembly D' is to include the seal member E fixed to the face of the first fixing part 410 on the Z'-direction side, the method for assembling the assembly D' includes bonding or otherwise fixing the seal member E to the face of the first fixing part 410 on the Z'-direction side before or after the electronic component 100 and the holder 200, or the electronic component 100, is held in the housing 300. When the seal member E is fixed, the or each first portion 311 of the housing body 310 of the or a respective housing 300 is inserted in the Z' direction through the or a respective through-hole E1 of the seal member E. Where the seal member E is also provided with the at least one through-hole E2, the first portion 311 of the housing body 310 of the or each housing 300 is inserted through the or a respective through-hole E1 of the seal member E, and the or each first protrusion 412 is inserted through the or a respective through-hole E2 of the seal member E.

Where the assembly D' is to include the seal member E to the mounting face 421a of the second fixing part 420, or to the face on the Z'-direction side of the first fixing part 410 and the mounting face 421a of the second fixing part 420, the method for assembling the assembly D' includes bonding or otherwise fixing the seal member E to the mounting face 421a of the second fixing part 420, or to the face on the Z'-direction side of the first fixing part 410 and the mounting face 421a of the second fixing part 420, after fixing the first fixing part 410 to the second fixing part 420 in a manner as described above. When the seal member E is fixed, the first portion 311 of the housing body 310 of the or each housing 300 is inserted in the Z' direction through the or a respective through-hole E1 of the seal member E. Where the seal member E is also provided with the at least one through-hole E2, the first portion 311 of the housing body 310 of the or each housing 300 is inserted through the or a respective through-hole E1 of the seal member E, and the or each first protrusion 412 is inserted through the or a respective through-hole E2 of the seal member E.

The following description is directed to the method for mounting the assembly D' to the adherend 10 of the first method. The steps of the first method for mounting the assembly D' to the adherend 10 are the same as those of the first method for mounting the assembly D to the adherend 10, except for the following steps.

The mounting face 421a of the second fixing part 420 of the assembly D' is mounted on the first face 11a of the adherend 10. At this time, the seal member E, which is on at least one of the face on the Z'-direction side of the first fixing part 410 and the mounting face 421a of the second fixing part 420 of the assembly D' ("at least one of the attachable faces" for short), is sandwiched between at least one of the attachable faces and the first face 11a of the adherend 10, and the first portion 311 of the or each housing body 310 of the assembly D' is inserted into the or a respective housing hole 13 of the adherend 10.

The seal member E thus mounted is then compressed between at least one of the attachable faces and the first face 11a of the adherend 10. In this state, the second fixing part 420 of the assembly D' is bonded, welded, or otherwise fixed to the first face 11a of the adherend 10 by bonding or welding.

The following description is directed to the method for assembling the assembly D' of the second method. This method is similar to, but different in respects below from, the method for assembling the assembly D' of the first method, and therefore, will be described focusing on the differences. This method deals with the assembly D' with the support 500 omitted.

When the or each electronic component 100 and the or a respective holder 200 are housed inside the housing body 310 of the or a respective housing 300, the or each holder 200 is fitted in, and held by, the or a respective housing body 310. In this way, the or each electronic component 100 and the or a respective holder 200 are held inside the or a respective housing 300 fixed to the or a respective first fixing part 410.

Where the at least one holder 200 is omitted, the or each electronic component 100 is housed in the housing body 310 of the or a respective housing 300, when the or each electronic component 100 is fitted in, and held by, the or a respective the housing body 310. In this way, the or each electronic component 100 is held inside the or a respective housing 300 fixed to first fixing part 410.

The method for mounting the assembly D' to the adherend 10 of the second method is similar to the method for mounting the assembly D' to the adherend 10 of the first method and will not be described to avoid overlapping descriptions.

Where the assembly D' includes the circuit board 600, the circuit board 600 may be fixed to the first fixing part 410 in a manner described manner after the electronic component 100 and the holder 200, or alternatively the electronic component 100, is held inside the housing 300. The circuit board 600 may be electrically connected to the electronic component 100 via a connection means described above, either before or after the circuit board 600 is fixed to the first fixing part 410. The circuit board 600 may be prepared with or without the at least one circuit part 700 and/or the connector 800 mounted thereon. Where the circuit board 600 is omitted, the steps in this paragraph should be omitted.

The first and second methods may be such that the assembly D' is attached to the adherend 10 after the assembly D' is assembled as described above, but the first and/or second methods may be modified in the order of the steps as follows. The second fixing part 420 may be fixed to the first face 11a of the adherend 10 before the electronic component 100 and the holder 200, or alternatively the electronic component 100, is held inside the housing 300 fixed to the first fixing part 410. After that, the first fixing part 410 with the housing 300 may be fixed to the second fixing part 420, and then the electronic component 100 and the holder 200, or alternatively the electronic component 100, may be held inside the housing 300 fixed to the first fixing part 410. In this case, it is preferable that the seal member E be fixed to the mounting face 421a of the second fixing part 420 before the second fixing part 420 is fixed to the first face 11a of the adherend 10. It is also preferable that the seal member E be thereafter held and compressed between the mounting face 421a of the second fixing part 420 and the first face 11a of the adherend 10, and that in this state the second fixing part 420 be fixed to the first face 11a of the adherend 10.

The combination S', the assembly D', and the first and second methods described above provide at least the technical features and effects (a) to (e) described above and the technical feature and effect (f) described below.

(f) The seal member E is provided to surround the first portion 311 of the housing body 310 of the at least one housing 300, and the seal member E is compressed between the face on the Z'-direction side of the fixing part 400 of the assembly D' and the first face 11a of the adherend 10 of the headliner H. This arrangement prevents dust and dirt from entering a ceiling part of a vehicle through a gap between the face on the Z'-direction side of the fixing part 400 and the first face 11a of the adherend 10 of the headliner H. In addition, where the first portion 311 of the housing body 310 of the at least one housing 300 houses a microphone as the electronic component 100 (or one or each of the electronic components 100), the seal member E, which is compressed between the face on the Z'-direction side of the fixing part 400 of the assembly D' and the first face 11a of the adherend 10 of the headliner H, suppresses entry of sounds from the Z-direction side relative to the assembly D' into a sound hole of the microphone.

The combinations of electronic component assemblies and adherends, the electronic component assemblies, and the methods for mounting an electronic component described above are not limited to the above-described embodiments, and may be modified within the scope of claims in the following manners, for example.

The seal member of any of the above aspects may not be fixed to the face on the Z'-direction side of a fixing part of an electronic component assembly, but simply compressed and held between a fixing part of an electronic component assembly described above and the first face of an adherend described above. In this case, the seal member is not part of the electronic component assembly but part of the combination of the electronic component assembly and the adherend. Also in this case, the first and second methods may be such that the seal member be held between a fixing part of the electronic component assembly and the first face of the adherend when the fixing part is placed on the first face. The seal member of the invention may be omitted.

The first fixing part 410 and the second fixing part 420 of the fixing part 400 of any of the above may be separate parts as described above or may be provided as an integrated fixing part. The integrated first and second parts 410, 420 may have any aspect described above but be dispensed with the at least one engaging claw 422, the at least one second protrusion 413, the at least one positioning hole 424, and the at least one positioning portion 425. Also in this case, the first and second methods of any aspects above are modified to be dispensed with the step of fixing the first fixing part 410 to the second fixing part 420.

The fixing part of the invention may be fixed to the first face of the adherend by bonding or welding as described above, or by any other fixing method as long as the fixing part is fixed to the first face of the adherend without protruding in the Z' direction relative to the second face of the adherend. For example, one of the fixing part and the adherend of any of the above aspects may be provided with at least one engaging protrusion, and the other with at least one engaging hole, and the at least one engaging protrusion may be fitted in the at least one engaging hole. Where the at least one engaging protrusion is provided on the fixing part of any of the above aspects, the or each engaging protrusion may have a dimension in the Z-Z' direction that is equal to, or smaller than, that of the adherend in the Z-Z' direction, so that the at least one engaging protrusion does not protrude in the Z' direction relative to the second face of the adherend. Alternatively, the fixing part of any of the above aspects may be fixed to the adherend of any of the above aspects with at least one screw. Also, in this case, it is preferable that the at least one screw not protrude in the Z' direction relative to the second face of the adherend.

The electronic component, or one or each of the electronic components, of the invention may be an acoustic component as described above but may be an electronic component of other kind. For example, the electronic component, or one or each of the electronic components, may be a sensor, a camera unit, a light emitting device, an active component, a passive component, a circuit board, or the like. Some examples of the sensor are a motion sensor, an acceleration sensor, a temperature sensor, a humidity sensor, a temperature and humidity sensor, or the like. The light emitting device may be an LED or the like. The active component may be a semiconductor device, an electric motor, or the like. The passive component may be a resistor, a capacitor, a coil, a transformer, a relay, a piezoelectric element, an oscillator, or the like.

As used herein the term "generally tubular shape" means a generally tubular shape as a whole. The generally tubular shape may have a cross section of a circular or polygonal shape, or of a circular or polygonal shape that is partly cut out, or the like.

The adherend of the invention may form part of a lining of a ceiling part of a vehicle as described above, but may be a component of other kind that includes a first face, a second face opposite to the first face, and at least one opening (housing hole) that opens in at least the first face to house the first portion of the at least one housing body of any of the above aspects.

The first and second directions of the invention may correspond to the directions along the thickness of the adherend of the invention as described above. The first direction may alternatively be any other direction in which the first face of the adherend faces and the housing hole opens. The second direction of the invention may be any direction opposite to the first direction.

The present invention can include any combination of these various features or embodiments above and/or below as set-forth in sentences and/or paragraphs. Any combination of disclosed features herein is considered part of the present invention and no limitation is intended with respect to combinable features.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

REFERENCE SIGNS LIST

S, S': combination of electronic component assembly and adherend
H: headliner (lining)
10: adherend
11: recess
11a: first face
12: second face
13: housing hole
14: positioning hole
20: cushioning material
30: cloth
D, D': electronic component assembly
100: electronic component
200: holder
300: housing
310: housing body
311: first portion
311a: bottom
311b: through-hole
312: second portion
320: fixed portion
321: flange
322: piece member
400: fixing part
410: first fixing part 411: hole
412: first protrusion
413: second protrusion
420: second fixing part
421: base
421a: mounting face
422: engaging claw
423: opening
424: positioning hole
425: protrusion
500: support
510: support body
520: leg
600: circuit board
700: circuit part
800: connector
900: cover
E: seal member
E1, E2: through-hole

What is claimed is:

1. A combination of an electronic component assembly and an adherend, the combination comprising:
an adherend including a first face on a first-direction side, a second face on a second-direction side, and a housing hole opening in the first face, the second direction being opposite to the first direction; and
an electronic component assembly comprising:
a fixing part fixed to the first face of the adherend;
an electronic component; and
a housing including:
a fixed portion fixed to the fixing part; and
a housing body to house the electronic component, the housing body including a first portion disposed on the second-direction side relative to the fixing part, wherein
the first portion of the housing body has a dimension in the second direction that is equal to, or smaller than, a dimension in the second direction of the housing hole of the adherend,
the first portion of the housing body is housed in the housing hole of the adherend,
the housing body is of a tubular shape opening in the first direction and including a bottom on the second-direction side,
the fixed portion extends from the housing body and is located on the first-direction side relative to the first portion of the housing body,
the bottom of the housing body of the housing is in direct abutment with the electronic component, and
the electronic component assembly further comprises a support, the support including:
a support body fixed to the fixing part; and
a leg extending from the support body in the second direction, being received inside the housing body, and being in direct abutment with the electronic component.

2. The combination according to claim 1, wherein the bottom of the housing body is provided with at least one bottom through-hole extending through the bottom in the second direction.

3. The combination according to claim 1, wherein the housing is formed of a metal plate.

4. The combination according to claim 1, wherein the electronic component assembly further comprises:
a circuit board fixed to the support body; and
at least one of a connector or a circuit part, being mounted on the circuit board and electrically connected to the electronic component.

5. The combination according to claim 1, wherein the fixing part includes a first fixing part and a second fixing part,
the first fixing part is attached the second fixing part,
the second fixing part is fixed to the first face of the adherend, and
the fixed portion of the housing is fixed to the first fixing part.

6. The electronic component assembly according to claim 1, wherein
the electronic component assembly further comprises a holder constituted by an elastic body, and
the holder holds the electronic component and is housed in the housing together with the electronic component.

7. The combination according to claim 1, wherein
the electronic component assembly further comprises a seal member,
the seal member is fixed to a face on the second-direction side of the fixing part and in contact with the first face of the adherend,
the seal member includes a through-hole extending in the second direction through the seal member, and
the first portion of the housing body of the housing is inserted through the through-hole.

8. The combination according to claim 1, wherein the fixing part includes a first protrusion, the first protrusion protruding in the second direction and fitting in a positioning hole in the first face of the adherend.

9. The combination according to claim 1, wherein
the first portion of the housing of the electronic component assembly is not protruded in the second direction relative to the second face of the adherend.

10. The combination according to claim 9, wherein
the electronic component assembly further comprises a seal member compressed between the first face of the adherend and the fixing part, wherein
the seal member has a through-hole extending in the second direction through the seal member,
the first portion of the housing body of the housing of the electronic component assembly is inserted through the through-hole.

11. The combination according to claim 9, wherein
one of the fixing part and the first face of the adherend is provided with a first protrusion, and the other is provided with a positioning hole, and
the first protrusion is fitted in the positioning hole.

12. A method for assembling an electronic component to an adherend, the method comprising:
preparing an adherend including a first face on a first-direction side, a second face on a second-direction side, and a housing hole opening in the first face, the second direction being opposite to the first direction;
preparing a fixing part and a housing, the housing including:
a housing body opening in the first direction and including a first portion, the first portion being disposed on a second-direction side relative to the fixing part, and
a fixed portion fixed to the fixing part;
arranging the first portion of the housing body of the housing to be housed in the housing hole of the adherend, without protruding the first portion of the housing body to the second-direction side relative to the second face of the adherend, and placing the fixing part on the first face of the adherend;

fixing the fixing part to the first face of the adherend;
preparing an electronic component before or after placing the fixing part;
arranging the prepared electronic component to be housed inside the housing body, wherein the arranging of the electronic component to be housed inside the housing body includes bringing the electronic component into direct abutment with a bottom of the housing body,
preparing a support, the support including a support body and a leg extending in the second direction from the support body;
after the electronic component is housed inside the housing body, inserting the leg of the support into the housing body to bring the leg into direct abutment with the electronic component; and
fixing the support body to the fixing part.

13. The method according to claim 12, wherein the electronic component is held in a holder constituted by an elastic body, and the arranging of the electronic component to be housed inside the housing body includes arranging the electronic component and the holder to be housed inside the housing body.

14. The method according to claim 12, wherein
the fixing part includes a first fixing part and a second fixing part,
the first fixing part is attached the second fixing part,
the fixed portion of the housing is fixed to the first fixing part, and
the fixing of the fixing part to the first face of the adherend includes fixing the second fixing part to the first face of the adherend.

15. The method according to claim 12, wherein
the method further comprises preparing a seal member surrounding the first portion of the housing body of the housing,
the placing of the fixing part on the first face of the adherend includes arranging the seal member to be held between the first face of the adherend and the fixing part, and
the fixing of the fixing part to the first face of the adherend includes compressing the seal member between the first face of the adherend and the fixing part.

16. The method according to claim 12, wherein
one of the fixing part or the first face of the adherend is provided with a plurality of first protrusions, and the other is provided with a plurality of positioning holes, and
the placing of the fixing part on the first face of the adherend includes fitting the first protrusions into the positioning holes.

17. A combination of an electronic component assembly and an adherend, the combination comprising:
an adherend including a first face on a first-direction side, a second face on a second-direction side, and a housing hole opening in the first face, the second direction being opposite to the first direction; and
an electronic component assembly comprising:
a fixing part fixed to the first face of the adherend;
an electronic component; and
a housing including:
a fixed portion fixed to the fixing part; and
a housing body to house the electronic component, the housing body including a first portion disposed on the second-direction side relative to the fixing part, wherein
the first portion of the housing body has a dimension in the second direction that is equal to, or smaller than, a dimension in the second direction of the housing hole of the adherend,
the first portion of the housing body is housed in the housing hole of the adherend,
the housing body is of a tubular shape opening in the first direction and including a bottom on the second-direction side,
the fixed portion extends from the housing body and is located on the first-direction side relative to the first portion of the housing body,
the bottom of the housing body of the housing is in abutment with the electronic component via a first different member, and
the electronic component assembly further comprises a support, the support including:
a support body fixed to the fixing part; and
a leg extending from the support body in the second direction, being received inside the housing body, and being in abutment with the electronic component via a second different member, and
the electronic component assembly further comprises a seal member, wherein
the seal member is fixed to a face on the second-direction side of the fixing part and in contact with the first face of the adherend,
the seal member includes a through-hole extending in the second direction through the seal member, and
the first portion of the housing body is inserted through the through-hole.

18. The electronic component assembly according to claim 17, wherein
the electronic component assembly further comprises a holder being constituted by an elastic body and including the first and second different member, wherein
the holder holds the electronic component and is housed in the housing together with the electronic component,
the bottom of the housing body of the housing abuts the first different member of the holder, and
the leg of the support abuts the second different member of the holder.

* * * * *